(12) United States Patent
Takahashi

(10) Patent No.: US 6,583,856 B1
(45) Date of Patent: Jun. 24, 2003

(54) EXPOSURE APPARATUS AND FABRICATION METHOD OF SEMICONDUCTOR DEVICE USING THE SAME

(75) Inventor: Tetsuo Takahashi, Yokohama (JP)

(73) Assignee: Nikon Corporation, Tokyo (JP)

(*) Notice: Subject to any disclaimer, the term of this patent is extended or adjusted under 35 U.S.C. 154(b) by 155 days.

(21) Appl. No.: 09/656,030

(22) Filed: Sep. 6, 2000

Related U.S. Application Data

(63) Continuation of application No. PCT/JP99/01054, filed on Mar. 4, 1999.

(30) Foreign Application Priority Data

Mar. 6, 1998 (JP) .............................................. 10-73346

(51) Int. Cl.[7] .................. G03B 27/42; G03B 27/72; G03B 27/54; G03B 27/52
(52) U.S. Cl. ........................... 355/69; 355/53; 355/67; 355/55
(58) Field of Search .............................. 355/30, 52, 53, 355/55, 67–71, 77; 356/399–401; 250/548; 359/726–730

(56) References Cited

U.S. PATENT DOCUMENTS

| | | | |
|---|---|---|---|
| 4,697,087 A | 9/1987 | Wu | 250/548 |
| 5,202,748 A | 4/1993 | MacDonald et al. | 356/360 |
| 5,243,195 A | 9/1993 | Nishi | 250/548 |
| 5,298,939 A | 3/1994 | Swanson et al. | 355/53 |
| 5,539,497 A | 7/1996 | Nishi | 355/53 |
| 5,729,331 A | 3/1998 | Tanaka et al. | 355/53 |
| 5,828,573 A * | 10/1998 | Hayashi | 364/468.28 |
| 5,881,165 A * | 3/1999 | Tanaka | 382/151 |
| 5,953,106 A * | 9/1999 | Unno et al. | 355/53 |
| 5,995,198 A | 11/1999 | Mizutani | 355/53 |
| 6,020,964 A | 2/2000 | Loopstra et al. | 356/358 |
| 6,084,673 A | 7/2000 | Van Den Brink et al. | 356/358 |
| 6,122,058 A | 9/2000 | Van Der Werf et al. | 356/349 |

FOREIGN PATENT DOCUMENTS

| | | |
|---|---|---|
| JP | 63-41023 | 2/1988 |
| JP | 5-21314 | 1/1993 |
| JP | 7-22350 | 1/1995 |
| JP | 7-72393 | 3/1995 |
| JP | 7-52712 | 6/1995 |
| JP | 7-335525 | 12/1995 |
| JP | 8-17720 | 1/1996 |

* cited by examiner

Primary Examiner—Henry Hung Nguyen
(74) Attorney, Agent, or Firm—Miles & Stockbridge P.C.

(57) ABSTRACT

Alignment is carried out between a mask and a wafer even during exposure as occasion demands, according to the movement of a pattern image caused by the positional fluctuation of a reflecting member. An exposure apparatus includes detection systems (13) and (14) for detecting the fluctuation amounts of reflecting members (M1) and (M2) from a reference position, and an arithmetic system (15) adapted to compute an amount of correction based on the detected fluctuation amounts, the amount of correction regarding at least one of the mask and the photosensitive substrate (4), and being necessary for substantial alignment between the pattern image formed in a moved state from a reference image-forming position and the photosensitive substrate (4). Based on the computed amount of correction, at least one of the mask and the photosensitive substrate is moved.

56 Claims, 12 Drawing Sheets ized by the added half prism. In addition, since the optical
EXPOSURE APPARATUS AND FABRICATION METHOD OF SEMICONDUCTOR DEVICE USING THE SAME This application claims the benefit of Japanese Application No. 10-073346 and is a continuation of International Application No. PCT/JP99/01054 which are hereby incorporated by reference.

BACKGROUND OF THE INVENTION

1. Field of the Invention

The present invention relates to an exposure apparatus, and the fabrication method of a semiconductor device using the same. More particularly, the present invention relates to the alignment of a mask with a wafer in a projection exposure apparatus having a projection optical system mounted thereon, which is a catadioptric type including a reflecting member.

2. Related Background Art

Conventionally, a projection exposure apparatus has been used for fabricating a semiconductor device, a flat panel display device (e.g., a liquid crystal display device), and so on in a lithography process. With a great increase made in the progress speed of a semiconductor technology in recent years, a progress in a microfabrication technology has been remarkable. For example, in a semiconductor device having a memory enabling writing/reading to be performed as occasion demands, i.e., Dynamic Random Access Memory (DRAM), currently a 16 M bit DRAM is a mainstream, but developments are under way to increase the degree of integration to the range of 256 M bit DRAM.

With such integration of the semiconductor device, an exposure wavelength has been made shorter than a currently mainstream i line (365 nm). In other words, a KrF excimer laser (oscillation wavelength 248 nm) has already been put to practical use. In addition, developments are under way to realize the practical use of an ArF excimer laser (oscillation wavelength 193 nm).

The shorter exposure wavelength causes a reduction in the transmittance of an optical material, and a great limitation is placed on the kinds of optical materials used for, for example a projection optical system. Consequently, in the conventionally mainstream exposure apparatus having the projection optical system of a catadioptric type, inconvenience inevitably occurs, i.e., the axial (longitudinal) chromatic aberration of the projection optical system becomes relatively large.

On the other hand, in the case of the exposure apparatus having the projection optical system of a catadioptric type, it is possible to suppress the axial chromatic aberration of the projection optical system even for the optical materials of limited kinds. However, in the projection optical system of the catadioptric type, because its optical axis is bent by the reflecting member without being linearly extended, inconvenience is inherent, i.e., the fluctuation of a mask pattern image (positional shift or rotational shift of an image) caused by the position fluctuation of the reflecting member occurs far more easily than that in the projection optical system of the refractive type. The projection optical system of the refractive type means a projection optical system including no reflecting members but a refraction system like a lens. The projection optical system of the catadioptric type means a projection optical system including at least one reflecting member and a refraction system like a lens.

Each of Japanese Patent Laid-Open No. 63-41023 and Japanese Patent Laid-Open No. 7-22350 disclose the system of alignment between a mask and a wafer (photosensitive substrate) in an exposure apparatus having the projection optical system of a catadioptric type mounted thereon. In the exposure apparatus disclosed in each of these publications, a beam splitter like a half prism is added in an optical path between the mask and the wafer, and the positions of the mask and the wafer relative to each other are measured by making an alignment light incident on the half prism.

Japanese Patent Laid-Open No. 5-21314 discloses a method of measuring the positions of a mask and a wafer relative to each other before exposure by using a reference mark formed on a wafer stage. This method is applied to the exposure apparatus of a scanning type (step-and-scan system) for transferring a mask pattern to each exposure area of the wafer while moving the mask and the wafer relative to each other with respect to the projection optical system of a refractive type.

In the exposure apparatus disclosed in each of Japanese Patent Laid-Open No. 63-41023 and Japanese Patent Laid-Open No. 7-22350, the half prism is added in the optical path between the mask and the wafer. In other words, in the optical path between the mask and the wafer, the half prism, not an essential component of the projection optical system, is disposed in surplus. Consequently, the optical performance of the projection optical system is adversely affected easily by the added half prism. In addition, since the optical separation surface (i.e., dividing surface of wave front) of the half prism cannot be corrected after its fabrication, excessively high accuracy is required for the fabrication of the half prism to prevent the optical performance of the projection optical system from being adversely affected.

On the other hand, in the case of the exposure apparatus described in Japanese Patent Laid-Open No. 5-21314, the positions of the mask and the wafer relative to each other are measured before exposure by using the reference mark formed on the wafer stage. In other words, the positions of the mask and the wafer relative to each other cannot be measured during exposure as occasion demands. Consequently, if the alignment system described in this publication is applied to the exposure apparatus having the projection optical system of the catadioptric type, even when the position of the reflecting member in the projection optical system changed during exposure and causes a mask pattern image to be shifted in position or rotation from a reference image-forming position, alignment between the mask and the wafer cannot be carried out for the projection optical system during exposure according to the positional or rotational shift of the mask pattern image as occasion demands.

DISCLOSURE OF THE INVENTION

The present invention is made with the foregoing problems in consideration. The object of the present invention is to provide an exposure apparatus capable of performing alignment between a mask and a wafer even during exposure as occasion demands, without providing any surplus optical members in an optical path between the mask and the wafer, and according to the positional or rational shift of a mask pattern image caused by the position fluctuation of a reflecting member disposed in the projection optical system of a catadioptric type. Another object of the present invention is to provide a fabrication method of a semiconductor device using the exposure apparatus.

In order to solve the foregoing problems, in accordance with a first aspect of the present invention, an exposure apparatus is provided, comprising: an illumination optical system for illuminating a mask having a specified pattern formed thereon; a projection optical system for projecting an image of the pattern on the mask to a photosensitive substrate through at least one reflecting member; a detection system for detecting an amount of fluctuation from the reference position of the at least one reflecting member; an arithmetic system for computing an amount of correction regarding at least one of the mask and the photosensitive substrate, to substantially align the pattern image formed in the state of being moved from a reference image-forming position with the photosensitive substrate, based on the amount of fluctuation detected by the detection system; and a driving system for moving at least one of the mask and the photosensitive substrate based on the amount of correction computed by the arithmetic system.

According to the preferred embodiment of the first aspect of the present invention, the arithmetic system computes the amount of positional shift and the amount of rotational shift of the pattern image from the reference image-forming position based on the amount of fluctuation detected by the detection system, and then computes the correction amount of the mask necessary for substantially correcting the amount of positional shift and the amount of rotational shift. The driving system moves only the mask based on the amount of correction computed by the arithmetic system. Alternatively, the arithmetic system computes the amount of positional shift and the amount of rotational shift of the pattern image from the reference image-forming position based on the amount of fluctuation detected by the detection system, and then computes the correction amount of the photosensitive substrate necessary for substantially aligning the photosensitive substrate with the pattern image formed in a state where at least one of the amount of positional shift and the amount of rotational shift occurs. The driving system moves only the photosensitive substrate based on the amount of correction computed by the arithmetic system. Otherwise, the arithmetic system computes the amount of positional shift and the amount of rotational shift of the pattern image from the reference image-forming position based on the amount of fluctuation detected by the detection system, then computes the correction amount of the mask necessary for substantially correcting one of the amount of positional shift and the amount of rotational shift, and still yet computes the correction amount of the photosensitive substrate necessary for substantially aligning the photosensitive substrate with the pattern image in a state where the other of the amount of positional shift and the amount of rotational shift occurs. The driving system moves the mask and the photosensitive substrate based on the correction amounts of the mask and the photosensitive substrate computed by the arithmetic system.

In accordance with a second aspect of the present invention, an exposure method is provided to project and expose a pattern image provided on a mask onto a workpiece through a projection optical system having at least one reflecting member.

In this case, the exposure method comprises: a detection step of detecting a fluctuation amount of the at least one reflecting member from a reference position; an arithmetic step of computing an amount of correction regarding at least one of the mask and a photosensitive substrate, necessary for substantially aligning the photosensitive substrate with the pattern image formed in a state of being moved from a reference image-forming position, based on the amount of fluctuation detected in the detection step; an alignment step of performing alignment between the mask and the photosensitive substrate with respect to the projection optical system by moving at least one of the mask and the photosensitive substrate based on the amount of correction computed in the arithmetic step; and an exposure step of illuminating the mask by an illumination optical system in a state where the mask and the photosensitive substrate are aligned with each other with respect to the projection optical system in the alignment step, and exposing a pattern of the mask on the photosensitive substrate through the projection optical system.

According to the preferred embodiment of the second aspect of the present invention, the detection step, the arithmetic step and the alignment step should preferably be performed before the exposure step. The detection step, the arithmetic step and the alignment step should preferably be performed during the exposure step as occasion demands. The exposure method should further comprise, preferably, a determination step of determining whether the fluctuation amount of the at least one reflecting member from the reference position is permissible or not and, if non-permissibility thereof is determined, then it is preferable that the arithmetic step and the alignment step are performed. The exposure apparatus should further comprise, preferably, a determination step of determining whether the fluctuation amount of the at least one reflecting member from the reference position is permissible or not and, if non-permissibility thereof is determined, then it is preferable that information regarding the amount of fluctuation is displayed. In addition, in the arithmetic step, an amount of correction should preferably be computed for at least one of the mask and the photosensitive substrate, which is necessary for substantial alignment between the mask and the photosensitive substrate with respect to the projection optical system. The computation is performed based on the movement amount of the pattern image from the reference image-forming position, which is obtained based on the amount of fluctuation detected in the detection step, and based on the position information of a mask stage for holding the mask and movable with respect to the projection optical system, and based on the position information of a substrate stage for holding the photosensitive substrate and movable with respect to the projection optical system.

Furthermore, in the first and second aspects of the present invention, the at least one reflecting member should preferably be a reflecting mirror having no power (refracting power).

DESCRIPTION OF THE PREFERRED EMBODIMENTS

Figure 1:
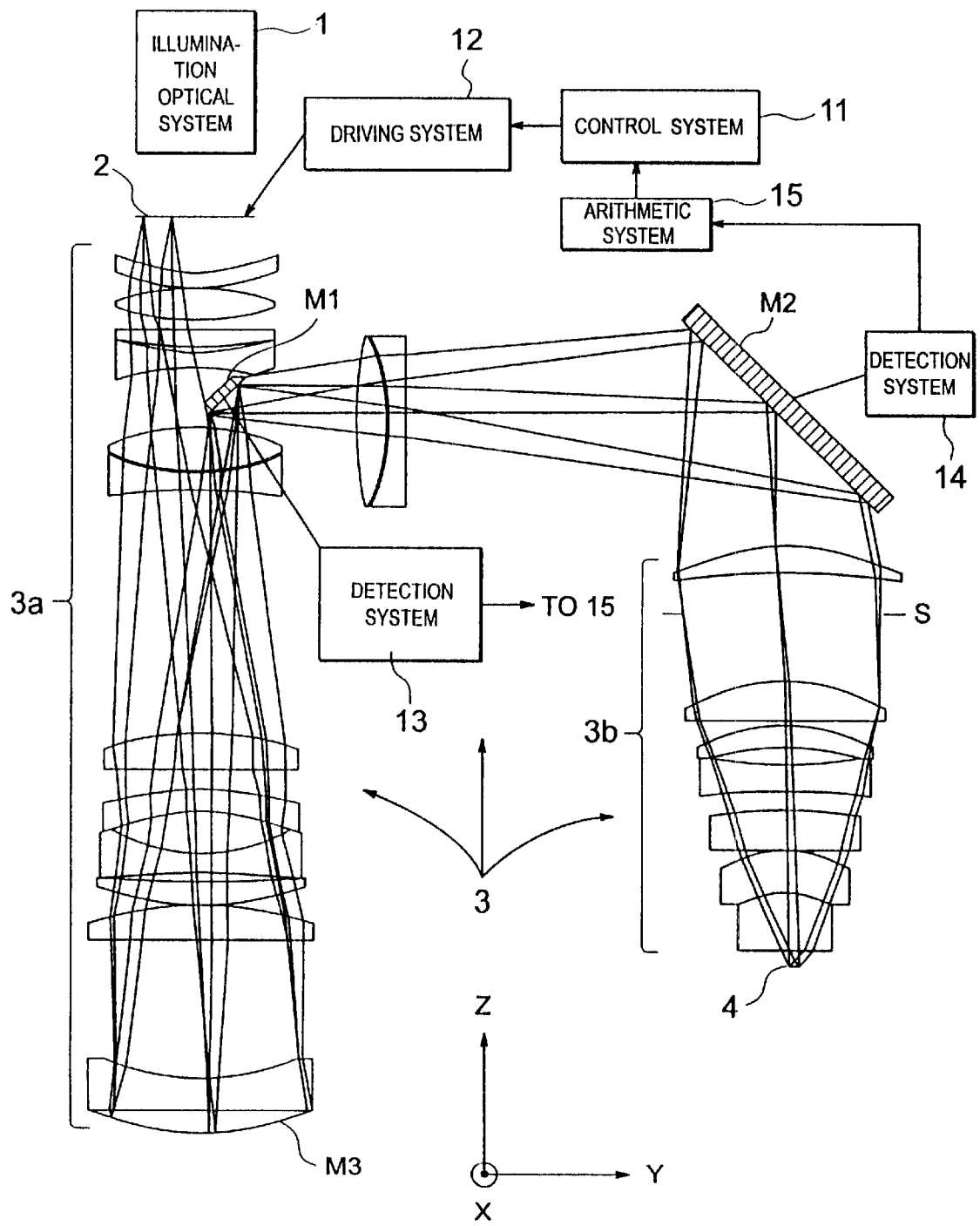
FIG. 1 is a schematic view showing a constitution of an exposure apparatus according to a first embodiment of the present invention.

According to the present invention, an amount of correction is obtained regarding at least one of a mask and a photosensitive substrate, necessary for substantial alignment between a pattern image formed in the state of being moved from a reference image-forming position and the photosensitive substrate, based on the fluctuation amount of a reflecting member disposed in a projection optical system from a reference position. Then, by moving at least one of the mask and the photosensitive substrate based on the obtained amount of correction, the pattern image and the photosensitive substrate are substantially aligned with each other. In the described specification, "reference image-forming position" means the position of a pattern image formed by the projection optical system in a state where the reflecting member is located in the reference position.

Specifically, an amount of positional shift and an amount of rotational shift of the pattern image from the reference image-forming position are computed based on the fluctuation amount of the reflecting member from the reference position, and a correction amount of the mask is computed, which is necessary for substantially correcting the amount of positional shift and the amount of rotational shift. Then, by moving only the mask based on the computed amount of correction, the position shift and the rotational shift of the pattern image are substantially corrected, enabling substantial alignment to be made between the pattern image and the photosensitive substrate.

In addition, an amount of positional shift and an amount of rotational shift of the pattern image from the reference image-forming position are computed based on the fluctuation amount of the reflecting member from the reference position, and a correction amount of the photosensitive substrate necessary for substantially aligning the photosensitive substrate with a pattern image is computed, the pattern image having been formed in a state where at least one of the amount of positional shift and the amount of rotational shift occurs. Then, moving only the photosensitive substrate based on the computed amount of correction, the photosensitive substrate is substantially aligned with the pattern image formed in the state of being moved from the reference image-forming position, enabling substantial alignment to be made between the pattern image and the photosensitive substrate.

Furthermore, an amount of positional shift and an amount of rotational shift of the pattern image are computed based on the fluctuation amount of the reflecting member from the reference position. A correction amount of the mask is computed, which is necessary for substantially correcting one of the amount of positional shift and the amount of rotational shift. Also, a correction amount of the photosensitive substrate is computed, which is necessary for substantially aligning the photosensitive substrate with a pattern image formed in a state where the other of the amount of positional shift and the amount of rotational shift occurs. Then, by moving the mask based on the computed correction amount of the mask to substantially correct only the positional shift (rotational shift) of the pattern image, and by moving the photosensitive substrate based on the computed correction amount of the photosensitive substrate to substantially align the same with the pattern image formed in the state of being shifted in rotation (shifted in position) from the reference image-forming position, substantial alignment can be made between the pattern image and the photosensitive substrate.

As can be understood from the foregoing, according to the present invention, it is possible to carry out alignment between the mask and a wafer even during exposure as occasion demands, without providing any surplus optical members in the optical path between the mask and the wafer as the photosensitive substrate, and according to the positional or rotational shift of the pattern image caused by the position fluctuation of the reflecting member disposed in the projection optical system of a catadioptric type. Therefore, even if fluctuation occurs in the position of the reflecting member during exposure to cause the positional or rotational shift of the pattern image, by carrying out alignment between the mask and the wafer during exposure as occasion demands, it is possible to fabricate a good semiconductor device always in the state of good alignment.

Now, the preferred embodiments of the present invention will be described with reference to the accompanying drawings.

FIG. 1 schematically shows the constitution of an exposure apparatus according to the first embodiment of the present invention. In the first embodiment, the present invention is applied to the projection exposure apparatus of a scanning type, which is designed to transfer a mask pattern to each exposure area of the wafer by means of scanning exposure while moving the mask and the wafer relative to each other with respect to the projection optical system of a catadioptric type.

In FIG. 1, a Z axis is set in parallel with the optical axis AXa of the mask side portion $3a$ of a projection optical system 3; a Y axis in parallel with the paper surface of FIG. 1 within a surface perpendicular to the Z axis; and an X axis perpendicularly to the paper surface of FIG. 1 within the surface perpendicular to the Z axis.

The exposure apparatus of FIG. 1 comprises an illumination optical system 1 for uniformly illuminating a mask 2 where a specified pattern formed thereon to be transferred. In the illumination optical system 1, for example, a light emitted from an ArF excimer laser light source is passed through a fly's eye lens to form a secondary light source having a plurality of light source images, and a light from this secondary light source is converged through a condenser lens and emitted toward the mask 2. Accordingly, by the light emitted from the illumination optical system 1, the mask 2 is uniformly illuminated in a superimposed manner. A field of illumination (area of illumination) formed on the mask 2 by the light emitted from the illumination optical system 1 has a rectangular shape extended thin and long in an X direction, and its center is made eccentric in a −Y direction with respect to the optical axis AXa of the mask side portion 3a of the projection optical system 3.

The mask 2 is supported on a mask stage (not shown) within an XY plane. The mask stage is constituted of an XY stage two-dimensionally movable within the XY plane, a rotary stage rotatable around the Z axis, and so on. The mask stage is driven and controlled by a driving system 12 based on a command from a control system 11.

The light passed through the pattern of the mask 2 is made incident on a concave mirror M3 along a −Z direction through the mask side portion 3a of the projection optical system 3. The light reflected on the concave mirror M3 in a +Z direction is made incident on a first reflecting mirror M1 disposed in the optical path of the mask side portion 3a of the projection optical system 3. The light reflected on the first reflecting mirror M1 in a +Y direction is made incident through two lens components on a second reflecting mirror M2. The light reflected on the second reflecting mirror M2 in the −Z direction is transmitted through the wafer side portion 3b of the projection optical system 3 to a wafer 4 as a photosensitive substrate coated with a photosensitive material such as a resist.

Accordingly, a pattern image of the mask 2 is formed on the wafer 4. An exposure field formed on the wafer 4 has a rectangular shape extended thin and long in the X direction corresponding to the field of illumination formed on the mask 2, and its center is made eccentric in the +Y direction with respect to the optical axis AXb of the wafer side portion 3b of the projection optical system 3 (see FIG., 3, described later). More specifically, the field of illumination formed on the mask 2 and the exposure field formed on the wafer 4 are similar to each other in shape, and their sizes and eccentric distances from the corresponding optical axes depend on the projection magnification of the projection optical system 3.

The wafer 4 is supported on a wafer stage within the XY plane. As in the case of the mask stage, the wafer stage is constituted of an XY stage two-dimensionally movable within the XY plane, a rotary stage rotatable around the Z axis, and so on.

Therefore, by carrying out scanning exposure while moving the mask 2 and the wafer 4 in the Y direction in synchronization with each other with respect to the projection optical system 3, a mask pattern can be transferred to one exposure area of the wafer 4. In addition, by repeating the scanning exposure while driving and controlling the wafer 4 two-dimensionally within the XY plane, mask patterns can be transferred sequentially to the respective exposure areas of the wafer 4 according to a so-called step-and-scan system.

According to the first embodiment, the exposure apparatus comprises a first detection system 13 for detecting a fluctuation amount of the first reflecting mirror M1 disposed in the projection optical system 3 from the reference position, and a second detection system 14 for detecting a fluctuation amount of the second reflecting mirror M2 from the reference position. The outputs of the first and second detection system 13 and 14 are supplied to an arithmetic system 15. In the arithmetic system 15, based on the fluctuation amounts of the first and second reflecting mirrors M1 and M2 from the reference position respectively detected by the first and second detection systems 13 and 14, a movement amount of a pattern image formed through the projection optical system 3 from a reference image-forming position, i.e., amounts of positional and rotational shift are computed.

Subsequently, in the arithmetic system 15, based on the computed amounts of positional and rotational shift, a correction amount of the mask 2 is computed, which is necessary for correcting the positional and rotational shift of the pattern image from the reference image-forming position. Information regarding the correction amount computed in the arithmetic system 15 is supplied to the control system 11.

In the control system 11, based on the information of the correction amount supplied from the arithmetic system 15, the mask stage is driven and controlled by the driving system 12. In this way, the mask 2 is moved by a required correction amount, and the positional and rotational shift of the pattern image from the reference image-forming position is corrected. As a result, the pattern image and the wafer 4 are aligned with each other.

Next, based on a specific constitution example, the alignment between the mask 2 and the wafer 4 of the first embodiment will be described.

Table (1) shows data values of the projection optical system 3 of the first embodiment. In the [entire data] of Table (1), NA represents a numerical aperture of an image (wafer), and β represents a projection magnification. In the [lens data] of Table (1), the first column represents the order of lens surfaces from the mask (object); r of the second column represents a radius of curvature a lens surface (∞ represents a plane); d of the third column represents a spacing between lens surfaces; and n of the fourth column represents a refractive index with respect to the oscillation wavelength λ=193.4 nm of the ArF excimer laser.

TABLE 1

[Entire data]
NA = 0.6
β = ¼
[Lens data]

| | r | d | n | |
|---|---|---|---|---|
| | ∞ | 60.000 | | (mask 2) |
| 1 | −210.000 | 18.000 | 1.56019 | |
| 2 | −233.058 | 1.734 | | |
| 3 | 301.818 | 32.109 | 1.50138 | |
| 4 | −415.393 | 19.449 | | |
| 5 | 154862.242 | 15.248 | 1.56019 | |
| 6 | −528.109 | 5.460 | | |
| 7 | −316.309 | 18.000 | 1.56019 | |
| 8 | 275.570 | 74.064 | | |
| 9 | 342.313 | 48.000 | 1.50138 | |
| 10 | −248.024 | 1.806 | | |
| 11 | −250.000 | 20.000 | 1.56019 | |
| 12 | 3438.110 | 286.849 | | |
| 13 | 390.013 | 40.000 | 1.50138 | |
| 14 | −2017.162 | 22.849 | | |
| 15 | 421.041 | 20.000 | 1.56019 | |
| 16 | 230.317 | 47.916 | | |
| 17 | −222.542 | 20.000 | 1.56019 | |
| 18 | 988.626 | 7.270 | | |
| 19 | −11949.023 | 27.617 | 1.50138 | |
| 20 | −328.913 | 0.500 | | |
| 21 | 365.306 | 42.285 | 1.56019 | |
| 22 | −1713.365 | 160.144 | | |
| 23 | −283.704 | 30.000 | 1.56019 | |
| 24 | 1076.349 | 30.701 | | |
| 25 | −353.136 | −30.701 | | (Concave mirror M3) |
| 26 | 1076.349 | −30.000 | 1.56019 | |
| 27 | −283.704 | −160.144 | | |
| 28 | −1713.365 | −42.285 | 1.56019 | |
| 29 | 365.306 | −0.500 | | |
| 30 | −328.913 | −27.617 | 1.50138 | |
| 31 | −11949.023 | −7.270 | | |
| 32 | 988.626 | −20.000 | 1.56019 | |

TABLE 1-continued

[Entire data]
NA = 0.6
β = ¼
[Lens data]

| | r | d | n | |
|---|---|---|---|---|
| 33 | −222.542 | −47.916 | | |
| 34 | 230.317 | −20.000 | 1.56019 | |
| 35 | 421.041 | −22.849 | | |
| 36 | −2017.162 | −40.000 | 1.50138 | |
| 37 | 390.013 | −286.849 | | |
| 38 | 3438.110 | −20.000 | 1.56019 | |
| 39 | −250.000 | −1.806 | | |
| 40 | −248.024 | −48.000 | 1.50138 | |
| 41 | 342.313 | −4.064 | | |
| 42 | ∞ | 180.000 | | (First reflecting mirror M1) |
| 43 | 506.214 | 34.041 | 1.50138 | |
| 44 | −256.332 | 3.017 | | |
| 45 | −250.000 | 20.000 | 1.56019 | |
| 46 | −1453.242 | 422.966 | | |
| 47 | ∞ | −150.000 | | (Second reflecting mirror M2) |
| 48 | −285.380 | −30.000 | 1.56019 | |
| 49 | −954.824 | −50.000 | | |
| 50 | ∞ | −78.332 | | (Aperture stop S) |
| 51 | −220.000 | −45.000 | 1.50138 | |
| 52 | −2665.536 | −6.535 | | |
| 53 | −200.000 | −27.411 | 1.56019 | |
| 54 | −516.467 | −18.844 | | |
| 55 | 632.373 | −30.000 | 1.56019 | |
| 56 | −1060.585 | −19.112 | | |
| 57 | −553.788 | −45.000 | 1.56019 | |
| 58 | 5823.302 | −0.500 | | |
| 59 | −153.299 | −45.000 | 1.56019 | |
| 60 | −120.000 | −1.243 | | |
| 61 | −125.615 | −66.000 | 1.56019 | |
| 62 | 3036.218 | −17.000 | | |
| | ∞ | | | (Wafer 4) |

Figure 2:
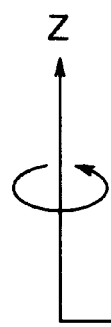
FIG. 2 is a view showing a state of rotational fluctuation of a first reflecting mirror M1 shown in FIG. 1 from a reference position clockwise around a Z axis.
Figure 2:
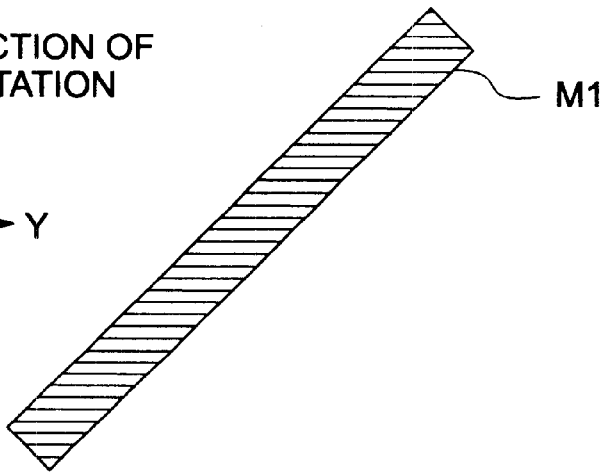
Figure 3:
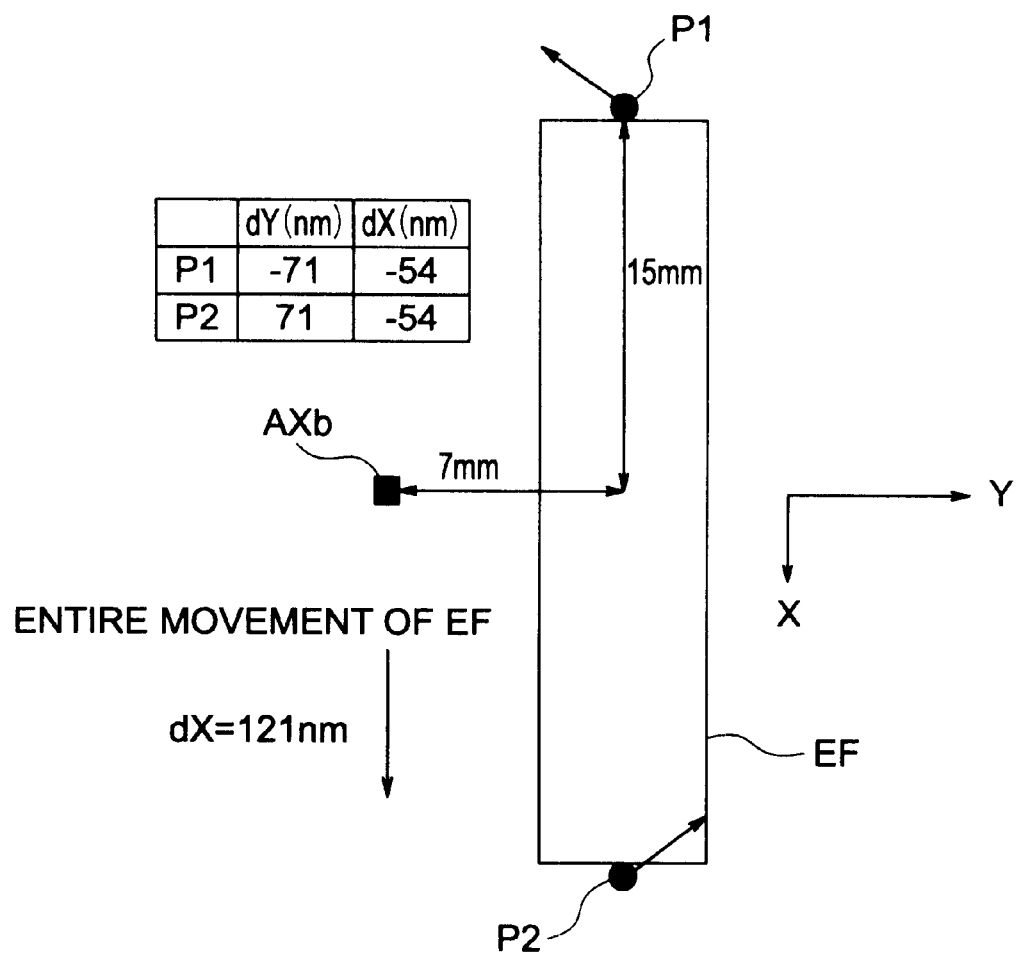
FIG. 3 is a view showing an entire movement of an exposure field EF and movements of image points P1 and P2 when rotational fluctuation occurs in the first reflecting mirror M1.

First, as shown in FIG. 2, consideration is given to a case where the first reflecting mirror M1 is shifted in rotation from the reference position by 1" (1 sec.) clockwise around the Z axis. In this case, as shown in FIG. 3, an exposure field EF to be formed on the wafer 4 by being made eccentric in the Y direction by +7 mm with respect to the optical axis AXb of the wafer portion 3b of the projection system 3 is moved as a whole in the X direction by dX=+121 nm. The end portion image point P1 of the exposure field EF away in the −X direction from the center of the exposure field EF by 15 mm is moved in the Y direction by dY=−71 nm, and in the X direction by dX=−54 nm. In addition, the end portion image point P2 of the exposure field EF away in the +X direction from the center of the exposure field EF by 15 mm is moved in the Y direction by dY=+71 nm, and in the X direction by dX=−54 nm.

Figure 4:
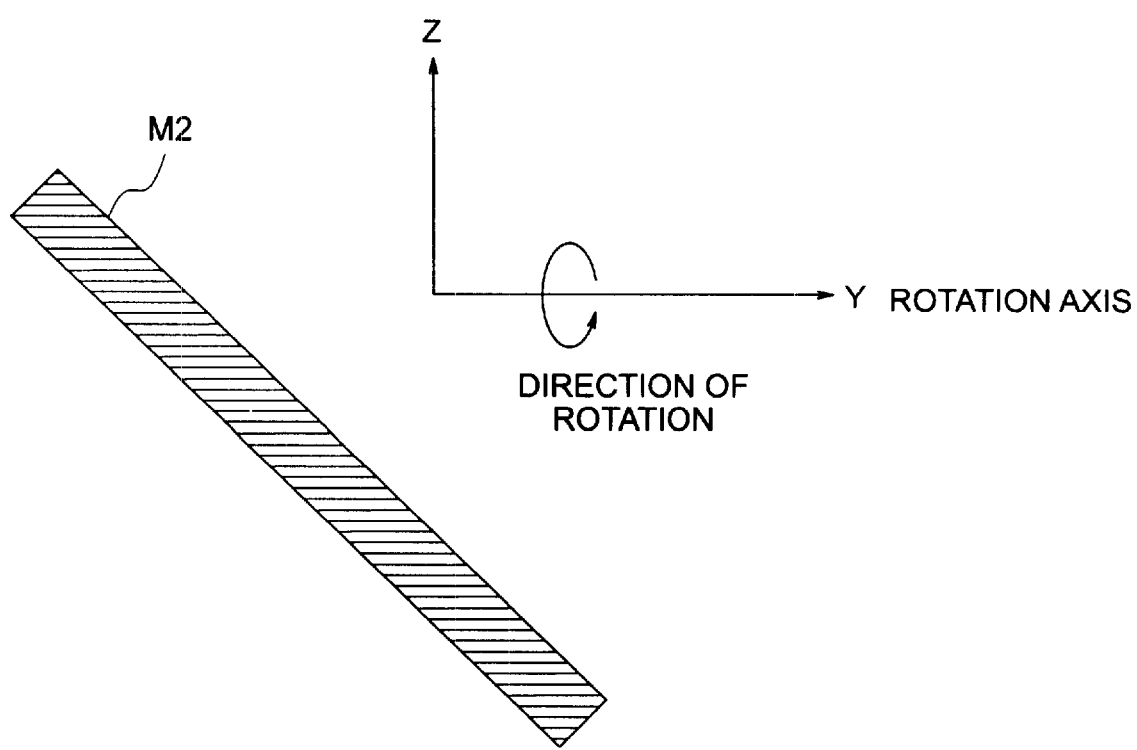
FIG. 4 is a view showing a state of rotational fluctuation of a second reflecting mirror M2 shown in FIG. 1 from the reference position clockwise around a Y axis.
Figure 5:
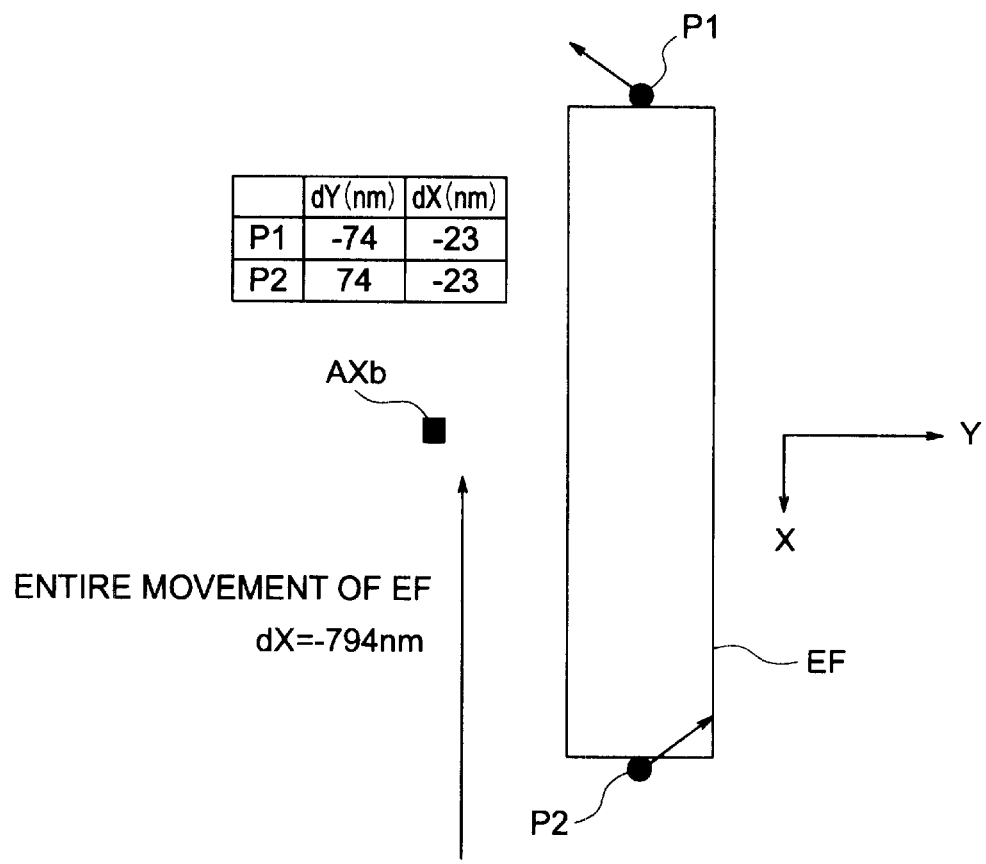
FIG. 5 is a view showing an entire movement of the exposure field EF and movements of the image points P1 and P2 when rotational fluctuation occurs in the second reflecting mirror M2.

Next, as shown in FIG. 4, consideration is given to a case where the second reflecting mirror M2 is shifted in rotation from the reference position by 1" clockwise around the Y axis. In this case, as shown in FIG. 5, the exposure field EF formed on the wafer 4 through the projection optical system 3 is moved as a whole in the X direction by dX=−794 nm. The end portion image point P1 of the exposure field EF away in the −X direction from the center of the exposure field EF by 15 mm is moved in the Y direction by dY=−74 nm, and in the X direction by dX=−23 nm. In addition, the end portion image point P2 of the exposure field EF away in the +X direction from the center of the exposure field EF by 15 mm is moved in the Y direction by dY=+74 nm, and in the X direction by dX=−23 nm.

Thus, when the first reflecting mirror M1 is shifted in rotation by 1" from the reference position clockwise around the Z axis, and the second reflecting mirror M2 is shifted in rotation by 1" from the reference position clockwise around the Y axis, the entire movement amount of the exposure field EF and the movement amounts of the image points P1 and P2 become as those shown in Table (2) as synthesized movement amounts in FIGS. 3 and 5.

TABLE 2

| | dY | dX |
|---|---|---|
| Entire movement amount of EF | 0 nm | −673 nm |
| Movement amount of image point P1 | −145 nm | −77 nm |
| Movement amount of image point P2 | +145 nm | −77 nm |

Specifically, when the first reflecting mirror M1 is shifted in rotated by 1" from the reference position clockwise around the Z axis, and the second reflecting mirror M2 is shifted in rotation by 1" from the reference position around the Y axis, a pattern image formed through the projection optical system 3 is shifted in position by dX=−673 nm in the X direction, and shifted in rotation by 2" clockwise around the Z axis.

As described above, according to the first embodiment, by moving only the mask 2 so as to correct the positional and rotational shift of the pattern image, alignment is performed between the pattern image and the wafer 4, and thus between the mask 2 and the wafer 4. Accordingly, in the specific constitution example of the first embodiment, the mask 2 is moved in the +X direction by 673 nm (amount of positional shift of the pattern image)×4 (inverse number of projection magnification)=2692 nm, and rotated clockwise around the Z axis by an angle equal to the rotational shift amount of the pattern image, i.e., 2". Thus, when only the mask 2 is moved based on a required correction amount, the entire movement amount of the exposure field EF and the movement amounts of the image points P1 and P2 are corrected as shown in Table (3).

TABLE 3

| | dY | dX |
|---|---|---|
| Entire movement amount of EF | 0 nm | 0 nm |
| Movement amount of image point P1 | 0 nm | −9 nm |
| Movement amount of image point P2 | 0 nm | −9 nm |

It can be understood from Table (3) that by moving only the mask 2 based on a required correction amount, the positional and rotational shift of the pattern image caused by the rotational fluctuation of the first and second reflecting mirrors M1 and M2 from the reference position can be corrected well. Focusing on the movements of the image points P1 and P2, the component dY of the Y direction is completely corrected, while the component dX of the X direction is left by a slight amount. However, optimization can be performed to reduce the component dX of the X direction by slightly deteriorating the component dY of the Y direction.

Figure 6A:
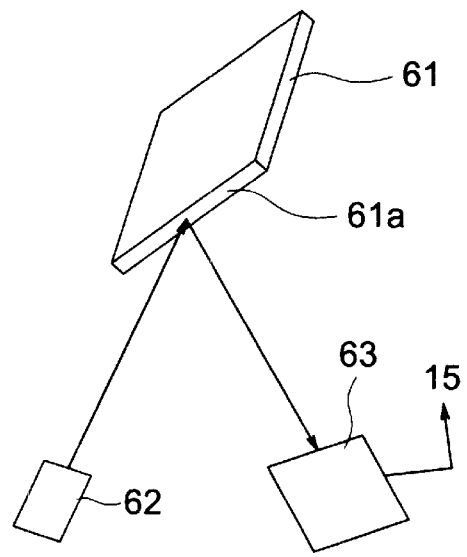
FIGS. 6A to 6C are schematic perspective views, each of them showing a specific constitution of a detection system for detecting a rotational fluctuation angle of a reflecting mirror.

As described above, in the specific constitution example of the first embodiment, the first detection system 13 detects the rotational fluctuation angle of the first reflecting mirror M1 around the Z axis, and the second detection system 14 detects the rotational fluctuation angle of the second reflecting mirror M2 around the Y axis. In this case, for the detection system for detecting the rotational fluctuation angle of the reflecting mirror, for example, a constitution like that shown in FIG. 6A can be employed. In FIG. 6A, the detection system like the first detection system 13 or the second detection system 14 includes an illumination unit 62 for obliquely illuminating the end surface 61a of a reflecting mirror 61 to be detected, and a detection unit 63 for detecting the light receiving position of a reflected light from the end surface 61a of the reflecting mirror 61. The detection unit 63 detects the rotational fluctuation angle of the reflecting mirror 61 based on the light receiving position of the reflected light from the end surface 61a of the reflecting mirror 61. A detecting signal from the detection unit 61 is supplied to the arithmetic system 15.

Figure 6B:
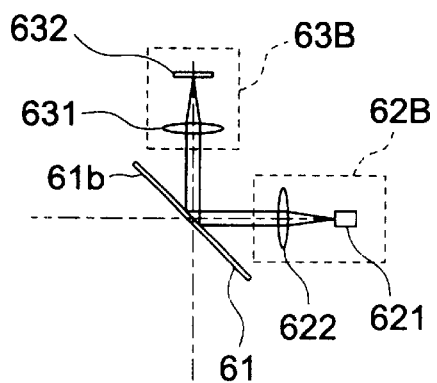
Figure 6C:
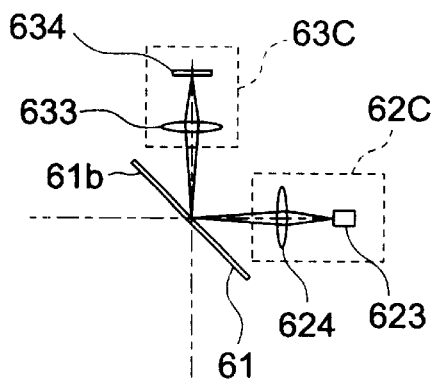

The first and second detection systems 13 and 14 can employ constitutions respectively shown in FIGS. 6B and 6C. In the detection systems shown in FIGS. 6B and 6C, the illumination unit 62 obliquely projects a light to the backside 61b of the reflecting mirror 61, and the light receiving position of a reflected light from the backside 61b of the reflecting mirror 61 is detected by the detection unit 63. As shown in FIGS. 6B and 6C, the rotational fluctuation and positional shift of the reflecting mirror 61 are detected by two groups of detection systems. In these variation examples as shown in FIG. 6B, the detection system of the first group includes, an illumination unit 62B having a light source 621 and a lens 622 for collimating lights from the light source 621, and a detection unit 63B having a lens 631 for converging a light reflected by the backside 61b of the reflecting mirror and a photoelectric conversion device 632 disposed in the converging position of the lens 631.

The detection system of the second group includes, an illumination unit 62C having a light source 623 and a lens 624 for converging lights from the light source 623 on the backside 61b of the reflecting mirror, and a detection unit 63C having a lens 633 for forming an image of the converging point of the backside 61b of the reflecting mirror and a photoelectric conversion device 634 disposed in the image-forming position of the lens 633.

The rotational amount of the reflecting mirror 61 can be measured by monitoring the shift of the converging position on the photoelectric conversion device 632 of the detection unit 63B. The positional shift of the backside 61b of the reflecting mirror in a normal direction can be monitored by monitoring the shift of the converging position on the photoelectric conversion device 634 of the detection unit 63C.

On the surface of the reflecting mirror 61, a reflection increasing film optimized for the wavelength region of an exposure light is deposited. On the backside 61b of the reflecting mirror 61, a reflection increasing film optimized for the wavelength region of a light (e.g., visible light) generated by the illumination unit 62 should preferably be deposited.

In the arithmetic system 15, the amounts of positional and rotational shift of the pattern image from the reference image-forming position are computed based on the rotational fluctuation angles of the first and second reflecting mirrors M1 and M2 respectively detected by the first and second detection system 13 and 14. Then, in the arithmetic system 15, based on the computed amounts of positional and rotational shift of the pattern image, the correction amount of the mask 2 is computed, which is necessary for substantially correcting the positional and rotational shift of the pattern image. Information regarding the amount of correction computed in the arithmetic system 15 is supplied to the control system 11. The control system 11 drives and controls the mask stage through the driving system 12 based on the information of the correction amount supplied from the arithmetic system 15. In this way, the mask 2 is moved by a required correction amount, and the positional and rotational shift of the pattern image from the reference image-forming position is substantially corrected. As a result, good alignment can be made between the pattern image and the wafer 4, and thus between the mask 2 and the wafer 4.

Figure 7:
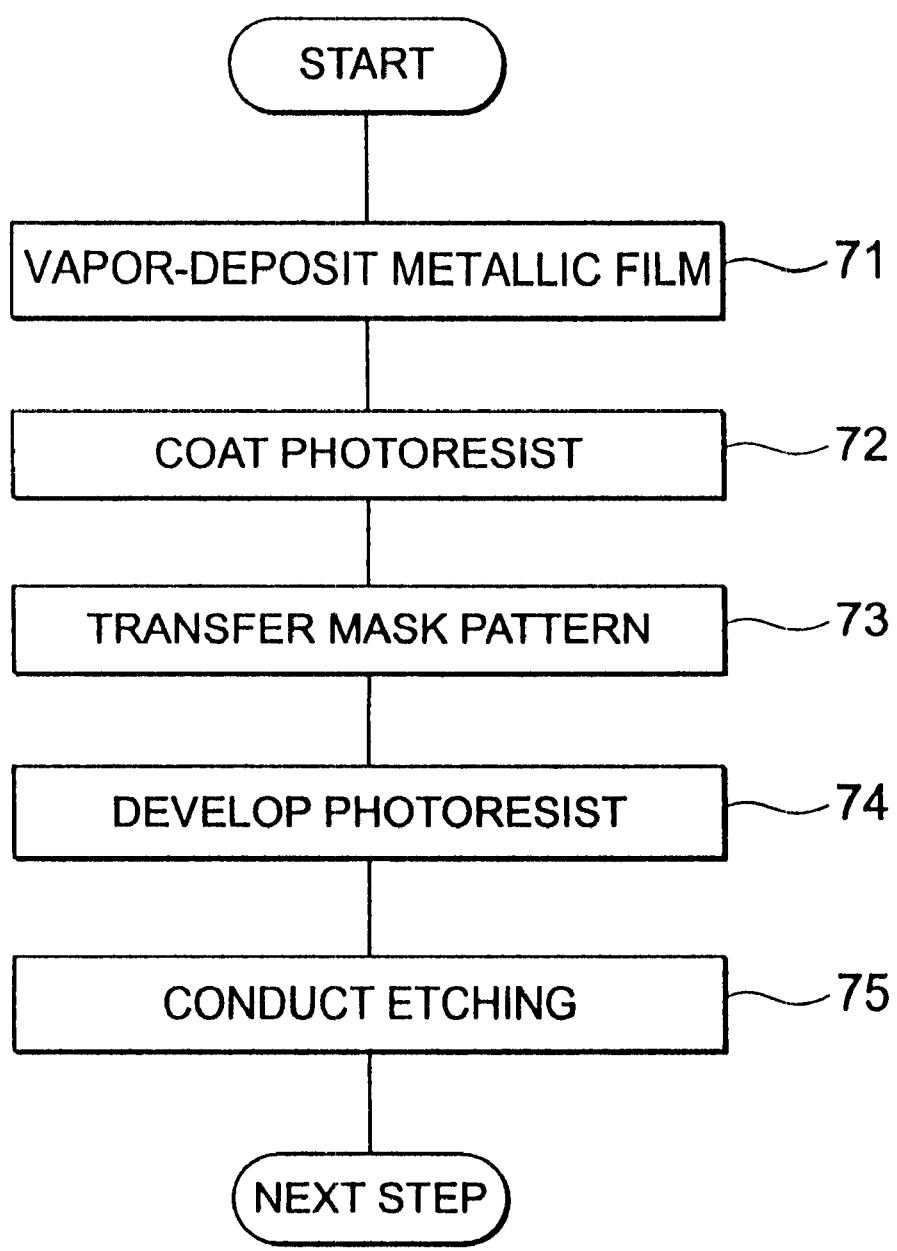
FIG. 7 is a flowchart illustrating processes for forming a specified circuit pattern on a wafer by using the exposure apparatus of the present invention.

After the alignment between the mask 2 and the wafer 4 is completed in the foregoing manner, the step moves to an exposure step (photolithography step). FIG. 7 is a flowchart illustrating respective steps for forming a specified circuit pattern on the wafer by using the exposure apparatus of the present invention.

First, in step 71 of FIG. 7, a metallic film is vapor-deposited on the wafer of one lot. Then, in step 72, a photoresist is coated on the metallic film of the wafer. Thereafter, in step 73, by using the exposure apparatus of the first embodiment, patterns on the wafer are sequentially transferred through the projection optical system to respective exposure areas on the wafer. Then, in step 74, the photoresist on the wafer is developed. Subsequently, in step 75, by performing etching using the photo resist pattern on the wafer as a mask, a circuit pattern corresponding to the pattern on the wafer is formed in each exposure area on each wafer. Then, a circuit pattern of a layer further thereon is formed, and the wafer passed through the wafer process is sent to a next step.

After the end of the wafer process, in actual assembling step, the steps including dicing for cutting the wafer into chips for each baked circuit, bonding for adding wiring to each chip, packaging for each chip, and so on are performed, and a semiconductor device such as an LSI or the like is fabricated at the end.

The present invention has been described by taking the example of fabricating the semiconductor device such as an LSI by the photolithography process in the wafer process using the exposure apparatus. However, by the photolithography process using the exposure apparatus, semiconductor devices, such a flat panel display device (e.g., a liquid crystal display device), a thin-film magnetic head, an imaging device (CCD or the like), and so on can also be fabricated.

As apparent from the foregoing, according to the first embodiment, without providing any surplus optical members in the optical path between the mask 2 and the wafer 4, alignment can be made between the mask 2 and the wafer 4 even during exposure as occasion demands, corresponding to the positional or rotational shift of the mask pattern image caused by the position fluctuation of the reflecting member M1 or M2 disposed in the projection optical system 3 of the catadioptric type. As a result, even if fluctuation occurs in the positions of the reflecting members M1 and M2 during scanning exposure to cause the mask pattern image to be shifted in position or rotation, by carrying out alignment between the mask 2 and the wafer 4 during scanning exposure as occasion demands, it is possible to fabricate a good semiconductor device always in a well-aligned state.

According to the first embodiment, in the arithmetic system 15, the amounts of positional and rotational shift of the pattern image are computed based on the rotational fluctuation angle of the reflecting mirror, and the required correction amount of the mask 2 is then computed based on the amounts of positional and rotational shift of the pattern image. However, without computing the movement amount (amount of positional and rotational shift) of the pattern image, the required correction amount of the mask 2 can be computed directly from the rotational fluctuation angle of the reflecting mirror. In this case, the movement amount of the pattern image and the required correction amount of the mask 2 can also be computed by, for example executing computation based on a specified arithmetic expression or referring to a specified memory table.

According to the first embodiment, the alignment is carried out between the pattern image and the wafer 4 by moving only the mask 2 to correct the positional or rotational shift of the pattern image. However, alignment can be made between the pattern image and the wafer by moving only the wafer 4, and aligning the wafer 4 with the pattern image formed by a movement from the reference image-forming position. If only the wafer 4 is moved in the foregoing specific constitution example, the wafer 4 is moved by 673 nm (amount of positional shift of the pattern image) in the −X direction, and rotated by an angle equal to the amount of rotational shift of the pattern image, i.e., 2", clockwise around the Z axis.

Alternatively, alignment can also be made between the pattern image and the wafer by moving both of the mask 2 and the wafer 4. If the mask 2 and the wafer 4 are moved in the foregoing specific constitution example, the mask 2 is moved by 2692 nm in the +X direction to correct the positional shift of the pattern image, and the wafer 2 is rotated by 2" clockwise around the Z axis to be aligned with the pattern image formed by rotational shift from the reference image-forming position. Alternatively, the mask 2 is rotated by 2" counterclockwise around the Z axis to correct the rotational shift of the pattern image, and the wafer 4 is moved by 673 nm in the −X direction to be aligned with the pattern image formed by positional shift from the reference image-forming position.

Furthermore, in the specific constitution example of the first embodiment, the first detection system 13 detects the rotational fluctuation angle of the first reflecting mirror M1 around the Z axis, and the second detection system 14 detects the rotational fluctuation angle of the second reflection mirror M2 around the Y axis. Then, because of the rotational fluctuation of the first reflecting mirror M1 around the Z axis and the rotational fluctuation of the second reflecting mirror M2 around the Y axis, the pattern image is shifted in position in the X direction and in rotation around the Z axis. However, the fluctuation amount of the reflecting member from the reference position detected by the detection system is not limited to the rotational fluctuation angle of the reflecting member around a specified axis. The concept thereof includes the amount of fluctuation, e.g., a rotational amount around the other axis, a three-dimensional movement amount, and so on.

Generally, if fluctuation occurs in the rotation of one or a plurality of reflecting members 3 around three axes or fluctuation occurs three-dimensionally in the position thereof, the pattern image may be three-dimensionally shifted in position or shifted in rotation around the three axes. In such a case, the mask stage and the wafer stage must be provided with a certain degree of freedom for three-dimensional movement and a certain freedom for rotation around the three axes. Specifically, in addition to the XY stage and the rotary stage around the Z axis, a Z stage movable in the Z direction and a leveling stage rotatable around the X and Y axes must be provided.

If the effect of the rotational fluctuation of the reflecting member is particularly predominant, then a rotational fluctuation angle around two axes orthogonal to a normal thereof is detected on the reflecting surface of the reflecting member. In this case, a local coordinate is set, which is composed of an X' axis parallel to the X axis and a Y' axis parallel to the Y axis on the reflecting surface of the first reflecting mirror M1 of the first embodiment, and the rotational fluctuation angle of the first reflecting mirror M1 around the X' axis and the rotational fluctuation angle around the Y' axis are detected. Similarly, a local coordinate is set, which is composed of an X' axis parallel to the X axis and a Y' axis parallel to the Y axis on the reflecting surface of the second reflecting mirror M2 of the first embodiment, and the rotational fluctuation angle of the second reflecting mirror M2 around the X' axis and the rotational fluctuation angle around the Y' axis are detected.

Figure 8:
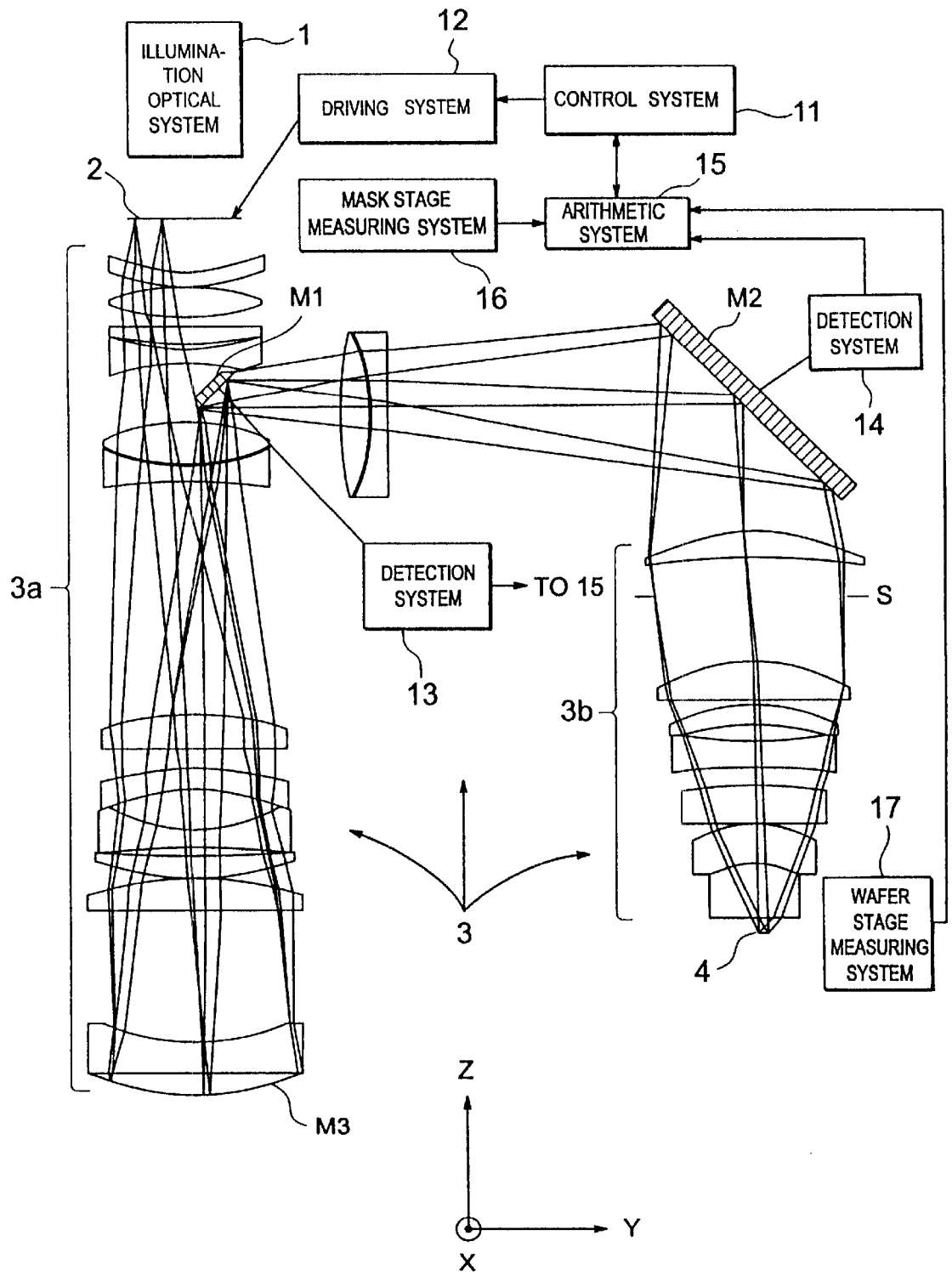
FIG. 8 is a schematic view showing a constitution of an exposure apparatus according to a second embodiment of the present invention.
Figure 9:
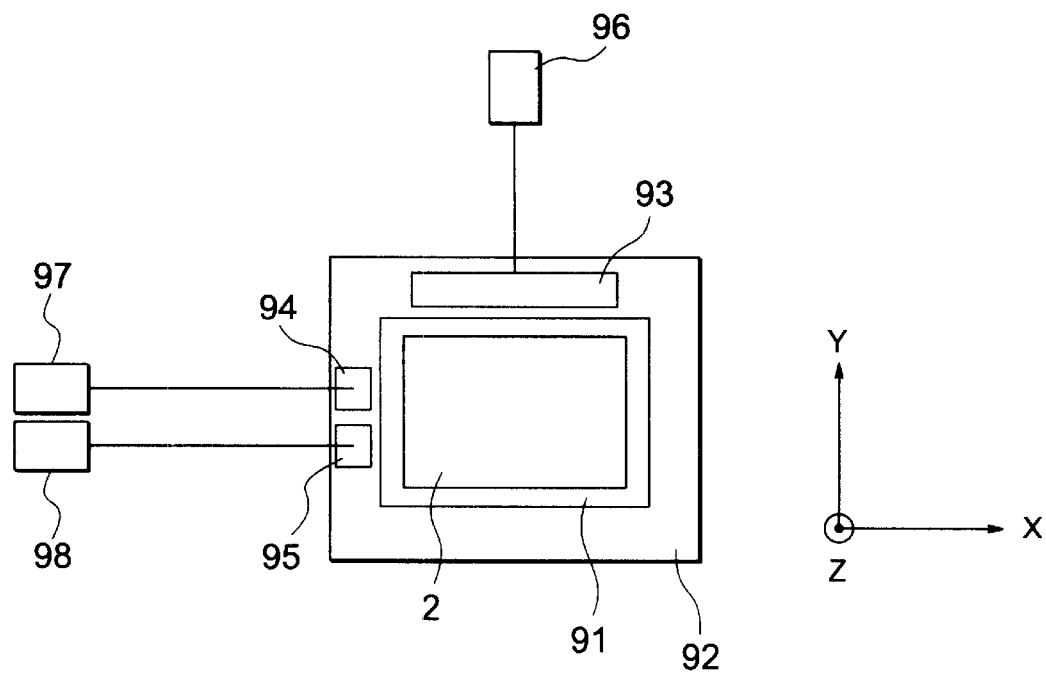
FIG. 9 is a schematic upper surface view showing a mask stage omitted in FIG. 8 and a constitution of a mask stage measuring system.
Figure 10:
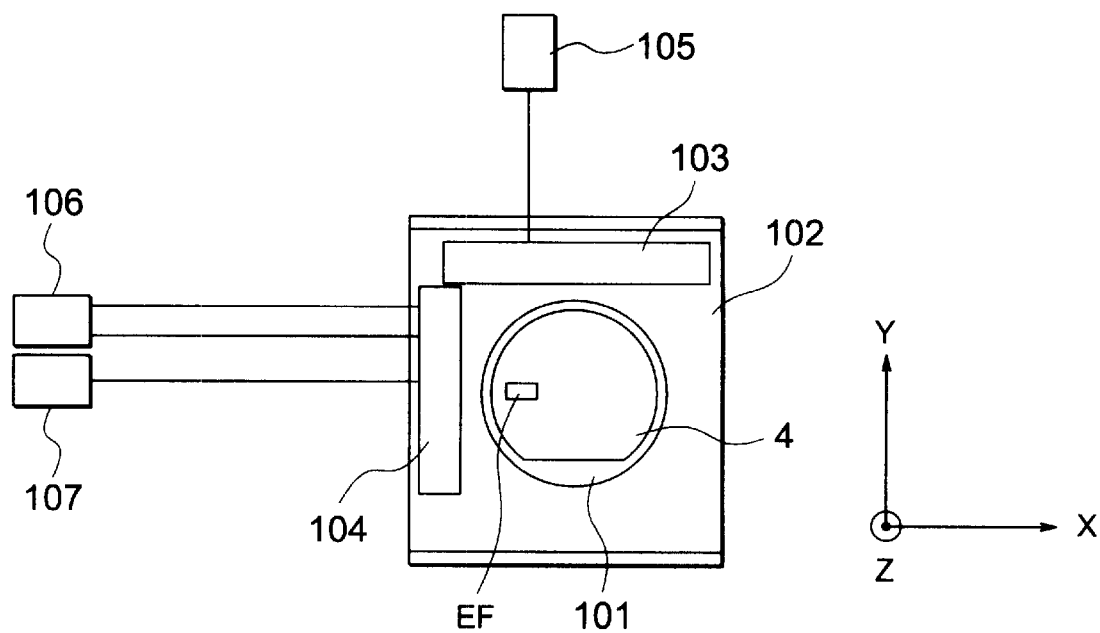
FIG. 10 is a schematic upper surface view showing a wafer stage omitted in FIG. 8 and a constitution of a wafer stage measuring system.

FIG. 8 schematically shows a constitution of an exposure apparatus according to a second embodiment of the present invention. FIG. 9 is a schematic upper surface view showing a mask stage omitted in FIG. 8 and a constitution of a mask stage measuring system. In addition, FIG. 10 is a schematic upper surface view showing a wafer stage omitted in FIG. 8 and a constitution of a wafer stage measuring system.

The first and second embodiments are similar to each other in constitution. The second embodiment is different from the first embodiment only in that alignment is carried out between the mask and the wafer also by taking into consideration information regarding the position of the mask stage and information regarding the position of the wafer stage. Accordingly, in FIG. 8, components having functions like those of the components of the first embodiment are denoted by reference numerals like those of FIG. 1. Now, the second embodiment will be described focusing on the difference from the first embodiment.

In FIG. 9, the mask 2 is supported on a mask stage 92 within the XY plane by a mask holder 91. The mask stage 9 is consisted of an XY stage two-dimensionally movable within the XY plane, a rotary stage rotatable around the Z axis, and so on. The rotational amount of the mask stage 92 on the XY coordinate and around the Z axis is always measured by a mask stage measuring system 16 (see FIG. 8).

In the mask stage measuring system 16, a mirror 93 having a reflecting surface extended in parallel with the XZ plane and long in the X direction is fixed on the mask stage 92. In addition, two corner cube prisms 94 and 95 adapted to move beams made incident in the +X direction in the Z direction in parallel, and then emit the beams in the −X direction are fixed on the mask stage 92 with a spacing set therebetween in the Y direction.

Further, the mask stage measuring system 16 includes a laser interferometer 96 for interference between a reflected beam obtained by making a beam incident perpendicularly to the reflecting surface of the mirror 93 and a reference beam. It also includes laser interferometers 97 and 98 for interference between reflected beams obtained by making beams incident on the corner cube prisms 94 and 95 in the X direction and reference beams. The laser interferometers 96 to 98 are supported by proper supports isolated from the mask stage 92. Thus, in the mask stage measuring system 16, the Y direction movement amount of the mask stage 92, i.e., a Y coordinate, can be measured based on the output of the laser interferometer 96. Also, based on the outputs of the laser interferometers 97 and 98, the XY direction movement amount of the mask stage 92, i.e., an X coordinate, and the rotational amount of the mask stage 92 around the Z axis can be measured. Information regarding the position of the mask stage 92 measured in the mask stage measuring system 16 is supplied to the arithmetic system 15.

In FIG. 10, the wafer 4 is supported on a wafer stage 102 within the XY plane by a wafer holder 101. The wafer stage 102 is consisted of an XY stage two-dimensionally movable within the XY plane, a rotary stage rotatable around the Z axis, and so on. The rotational amount of the wafer stage 102 on the XY coordinate and around the Z axis is always measured by a wafer stage measuring system 17 (see FIG. 8).

In the wafer stage measuring system 17, a mirror 103 having a reflecting surface extended in parallel with the XZ plane and long in the X direction is fixed on the wafer stage 102. In addition, a mirror 104 having a reflecting surface extended in parallel with the YZ plane and long in the Y direction is fixed on the wafer stage 102.

Further, the wafer stage measuring system 17 includes a laser interferometer 105 for interference between a reflected beam obtained by making a beam incident perpendicularly to the reflecting surface of the mirror 3 and a reference beam. The system also includes a laser interferometer 106 for interference between two reflected beams obtained by making incident two beams having a spacing set therebetween in the Y direction perpendicularly to the reflecting surface of the mirror 104. Further, the system includes a laser interferometer 107 for interference between a reflected beam and a reference beam, the reflected beam having been obtained by making a beam incident toward the center of the exposure field EF of the wafer 4 perpendicularly to the reflecting surface of the mirror 104.

The laser interferometers 105 to 107 are supported by proper supports isolated from the wafer stage 102. Accordingly, in the wafer stage measuring system 17, the Y direction movement amount of the wafer stage 102, i.e., a Y coordinate, can be measured based on the output of the laser interferometer 105. Based on the output of the laser interferometer 106, the rotational amount of the wafer stage 102 around the Z axis can be measured. Further, based on the output of the laser interferometer 107, the X direction movement amount of the wafer stage 102, i.e., an X coordinate, can be measured. Information regarding the position of the wafer stage 102 measured in the wafer stage measuring system 17 is supplied to the arithmetic system 15.

According to the second embodiment, as shown in FIG. 8, the outputs of the mask stage measuring system 16 and the wafer stage measuring system 17 are supplied together with the outputs of the first and second detection systems 13 and 14 to the arithmetic system 15. In the arithmetic system 15, the correction amount of the mask 2 is computed, which is necessary for substantial alignment between the mask 2 and the wafer 4 with respect to the projection optical system 3. This computation is performed based on the positional or rotational shift of the pattern image from the reference image-forming position computed from the rotational fluctuation angles of the first and second reflecting mirrors M1 and M2 respectively detected by the first and second detection systems 13 and 14, the information regarding the position of the mask stage measured by the mask stage measuring system 16 and the information regarding the position of the wafer stage measured by the wafer stage measuring system 17.

Information regarding the amount of correction computed in the arithmetic system 15 is supplied to the control system 11. The control system 11 drives and controls the mask stage via the driving system 12 based on the information of the correction amount supplied from the arithmetic system 15. Accordingly, the mask 2 is moved by a required amount of correction, the positional or rotational shift of the pattern image from the reference image-forming position is substantially corrected, and relative positional shift between the mask 2 and the wafer 4 caused by relative positional shift between the mask stage and the wafer stage is also corrected substantially. As a result, the mask 2 and the wafer 4 are well aligned with each other with respect to the projection optical system 3.

Therefore, as in the case of the first embodiment, in the second embodiment, without providing any surplus optical members in the optical path between the mask 2 and the wafer 4, alignment between the mask 2 and the wafer 4 can be performed even during exposure as occasion demands, according to the positional or rotational shift of the mask pattern image caused by the positional fluctuation of the reflecting member M1 or M2 disposed in the projection optical system 3 of the catadioptric type, and relative positional shift between the mask stage and the wafer stage. As a result, even if fluctuation occurs in the position of the reflecting member M1 or M2 during scanning exposure to cause positional or rotational shift of the mask pattern image, or relative positional shift between the mask stage and the wafer stage, by making alignment between the mask 2 and the wafer 4 during scanning exposure as occasion demands, a good semiconductor device can be fabricated always in a well-aligned state.

Similarly to the first embodiment, in the second embodiment, by moving only the wafer 4 or both of the mask 2 and the wafer 4, the mask 2 and the wafer 4 can be aligned with each other with respect to the projection optical system 3.

Each of the embodiments of the present invention has been described by taking the example of the exposure apparatus comprising the projection optical system having two reflecting mirrors (optical path deflecting member). However, the number and disposition of reflecting mirrors should not be limited to those of the first embodiment.

In each of the foregoing embodiments, the optical system of the catadioptric type is applied as a projection optical system. However, the present invention can be applied to an optical system having at least one reflecting member, for example, a reflection type optical system, a refractive type optical system having an optical path bending mirror, and so on.

In addition, each of the embodiments of the present invention has been described by taking the example of the exposure apparatus of a so-called step-and-scan system, which is designed to transfer a mask pattern to each exposure area of the wafer by executing scanning exposure while moving the mask and the wafer in synchronization with each other with respect to the projection optical system. However, the present invention can also be applied to the exposure apparatus of a so-called step and repeat type, which is designed to sequentially transfer mask patterns to the respective shot areas of the wafer two-dimensionally while moving only the wafer by stepping with respect to the projection optical system, and the exposure apparatus of other types.

Furthermore, in each of the foregoing embodiments, the ArF excimer laser light source is used as a light source for the illumination optical system. Instead, an $F_2$ excimer laser light source (wavelength 157 nm), a KrF excimer laser light source (wavelength 248 nm), a mercury lamp for supplying an i line (wavelength 365 nm) or one for supplying an electromagnetic wave of soft X-ray wavelength region of 13 nm can be used.

Figure 11:
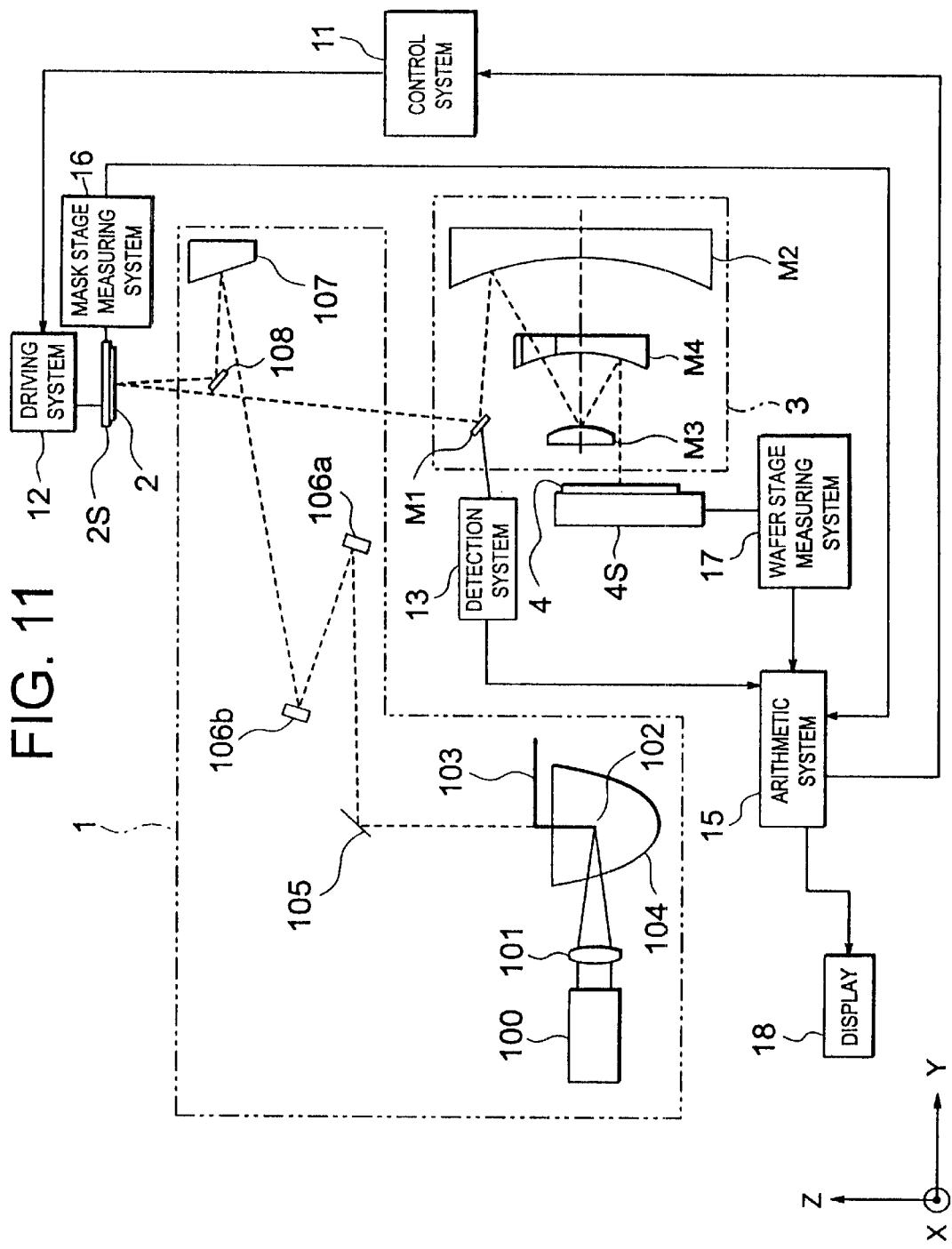
FIG. 11 is a schematic view showing a constitution of an exposure apparatus according to a third embodiment of the present invention.

FIG. 11 is a schematic view showing a constitution of an exposure apparatus according to a third embodiment of the present invention.

The exposure apparatus shown in FIG. 11 is a projection exposure apparatus for performing an exposing operation by a step-and-scan system using the light of a soft X-ray region (EUV light) having a wavelength of 5 to 15 nm as an illumination light for exposure. In FIG. 11, the optical axial direction of a reflection reduction projection optical system for forming a reduced image of a reflection type mask 2 as a projection original on the wafer 4 is set to be a Y direction; a direction within a paper surface orthogonal to the Y direction a Z direction; and a paper surface perpendicular direction perpendicular to YZ direction an X direction.

This projection exposure apparatus transfers all the circuit patterns of the reflection type mask 2 respectively to a plurality of shot areas on the wafer 4 by a step-and-scan system. Such transfer is performed by one-dimensionally scanning the mask 2 and the wafer 4 relative to each other with respect to a reflection reduction projection optical system 3 while projecting a part of the images of the circuit patterns drawn on the reflection type mask 2 as projection originals (reticle) through the reflection reduction projection optical system 3 onto the wafer 4.

In this case, as the EUV light as an illumination light for exposure in the described embodiment has a low transmittance for atmosphere, an optical path, through which the EUV light is passed, is covered with a vacuum chamber, not shown, to be shielded from external air.

First, an illumination optical system 1 shown in FIG. 11 will be described.

A laser light source 100 has a function of supplying a laser light having a wavelength of an infrared region to a visible region, and for example, a YAG laser or an excimer laser based on semiconductor laser excitation can be used. This laser light is converged by a converging optical system 101 to be converged on a position 102. A nozzle 103 injects a gaseous material to the position 102, and this injected material receives a high-illuminance laser light at the position 102. At this time, the injected material becomes high in temperature because of the energy of the laser light, excited in a plasma state, and emits an EUV light during its transition to a low potential state.

Around the position 102, an elliptic mirror 104 is disposed to constitute the converging optical system. This elliptic mirror 104 is positioned such that its first focus can nearly coincide with the position 102. On the inner surface of the elliptic mirror 104, a multilayer film is formed to reflect an EUV light. The EUV light reflected thereon is converged at the second focus of the elliptic mirror 104, and then passed toward a parabolic mirror 105 constituting the converging optical system. The parabolic mirror 105 is positioned such that its focus can nearly coincide with the second focus position of the elliptic mirror 104. On the inner surface thereof, a multilayer film is formed to reflect an EUV light.

An EUV light emitted from the parabolic mirror 105 is passed in a nearly collimated state toward reflection type fly's eye optical systems 106a and 106b as optical integrators. The reflection type fly's eye optical systems 106a and 106b are composed of a first reflection element group 106a integrating a plurality of reflecting surfaces, and a second reflection element group 106b having a plurality of reflecting surfaces corresponding to the plurality of reflecting surfaces of the first reflection element group 106a. On the plurality of reflecting surfaces constituting each of these first and second reflection element groups 106a and 106b, multilayer films for reflecting EUV lights are also provided.

The collimated EUV light from the parabolic mirror 105 is divided for its wave front by the first reflection element group 106a, and EUV lights from the respective reflecting surfaces are converged to form a plurality of light source images. The plurality of reflecting surfaces of the second reflection element group 106b is positioned respectively near the forming positions of the plurality of light source images. The plurality of reflecting surfaces of the second reflection element group 106b substantially function as field mirrors. Accordingly, the reflection type fly's eye optical systems 106a and 106b form a number of light source images as secondary light sources based on approximate parallel luminous fluxes from the parabolic mirror 105. Such a reflection type fly's eye optical system 106 is disclosed in Japanese Patent Application No. 10-47400 filed by the applicant of the present invention. In the described embodiment, to control the shape of the secondary light source, a σ diaphragm should preferably be provided near the second reflection element group 106b.

EUV lights emitted from the secondary light sources formed by the reflection type fly's eye optical systems 106a and 106b are passed toward a condenser mirror 107 positioned so as to set a focus position near the positions of the secondary light sources. After being reflected and converged by the condenser mirror 107, the EUV lights are passed through an optical path bending mirror 108 to reach the reflection type mask 2. On the surfaces of the condenser mirror 107 and the optical path bending mirror 108, multilayer films are formed to reflect the EUV lights. The condenser mirror 107 converges the EUV lights emitted from the secondary light sources, and uniformly illuminates the reflection type mask 2 in a superimposed manner.

In the described embodiment, to spatially separate an optical path between an illumination light directing the reflection mask 2 and an EUV light reflected by the reflection type mask 2 to direct the projection system, the illumination system is set as a non-telecentric system, and the reflection reduction projection optical system 3 is also set as a mask side non-telecentric optical system.

On the reflection type mask 2, a reflection film composed of a multilayer film for reflecting an EUV light is provided. This reflection film has a pattern corresponding to the shape of a pattern to be transferred onto the wafer 4 as a photosensitive substrate. An EUV light reflected by the reflection mask 2 and provided with the pattern information of the reflection mask 2 is made incident on the reflection reduction projection optical system 3.

The reflection reduction projection optical system 3 is constituted of a mirror M1 as an optical path bending mirror, a concave mirror M2, a convex mirror M3, and a concave mirror M4. The mirrors M1 to M4 constituting the reflection reduction projection optical system 3 have multilayers provided on the substrate to reflecting EUV lights.

The EUV light reflected by the reflection type mask 2 is passed through the reflection reduction projection optical system 3 to form, in the exposure area of circular arc shape on the wafer 2, a reduced image of the pattern of the reflection type mask 2 by a specified reduction magnification β (e.g., |β|=¼, ⅕, ⅙).

The reflection type mask 2 is supported by a mask stage 2S movable at least in the Y direction and in a rotational direction around the Z axis. The wafer 4 is supported by a wafer stage 4S movable in the XYZ direction. The movements of these mask and wafer stages 2S and 4S are achieved respectively by a mask stage driving system 12 and a wafer stage driving system (not shown). During an exposing operation, while illuminating the reflection type mask 2 with an EUV light by the illumination system 1, the reflection type mask 2 and the wafer 4 are moved with respect to the reflection type projection optical system 3 at a specified speed ratio set by the reduction magnification of the projection system 3. Thus, the pattern of the reflection type mask 2 is scanned and exposed within a specified shot area on the wafer 4.

According to the embodiment, the rotational amount of the mask stage 2S on the XY coordinate and around the Z axis is constantly measured by the mask stage measuring system 16, and information regarding the measured position of the mask stage 2S is supplied to the arithmetic system 15. In addition, the rotational amount of the wafer stage 4S on the XY coordinate and around the Z axis is constantly measured by the wafer stage measuring system 17, and information regarding the measured position of the wafer stage 4S is supplied to the arithmetic system 15.

The rotational fluctuation angle and the positional shift amount of the mirror M1 of the reflection reduction projection optical system 3 as a projection system are detected by the detection system 13, and outputted to the arithmetic system 15. In the arithmetic system 15, similarly to the foregoing second embodiment, the correction amount of the mask 2 is computed, which is necessary for substantial alignment between the mask 2 and the wafer 4 with respect to the projection system 3. This computation is performed based on the positional and rotational shift of the pattern image from the reference image-forming position obtained based on the rotational fluctuation angle and the amount of positional shift of the reflecting mirror M1 detected by the detection system 13, the position information of the mask stage 4S measured in the mask stage measuring system 16, and the position information of the wafer stage measured in the wafer stage measuring system.

Information regarding the amount of correction computed in the arithmetic system 15 is supplied to the control system 11. The control system 11 drives and controls the mask stage via the driving system 12 based on the information of the correction amount supplied from the arithmetic system 15. In this way, the mask 2 is moved by a required amount of correction to substantially correct the positional or rotational shift of the pattern image from the reference image-forming position. Also, relative positional shift between the mask 2 and the wafer 4 caused by the relative positional shift between the mask stage and the wafer stage is substantially corrected. As a result, the mask 2 and the wafer 4 are well aligned with each other with respect to the projection system 3.

As in the cases of the first and second embodiments, in the third embodiment, by moving only the wafer 4 or both of the mask 2 and the wafer 4, alignment can be made between the mask 2 and the wafer 4 with respect to the projection optical system 3.

In each of the foregoing embodiments, the rotational fluctuation angle of the plane mirror as an optical path deflecting member (optical path bending mirror) in the projection optical system was detected. However, the present invention can be applied even if a mirror for detecting the rotational fluctuation angle has power (e.g., a concave or convex mirror), as long as the mirror bends the optical axis. In such a case, not only the positional fluctuation or rotational shift of the image but also the change of an aberration state may occur. However, if the change of the aberration stage is within a permissible amount, by moving the position of at least one of the mask and the photosensitive substrate in this state, exposure can be realized under a good aligned state and an aberration corrected state. In addition, if the change of the aberration state exceeds the permissible amount, then the aberration state is corrected by moving a part of the optical member constituting the projection optical system.

Figure 12:
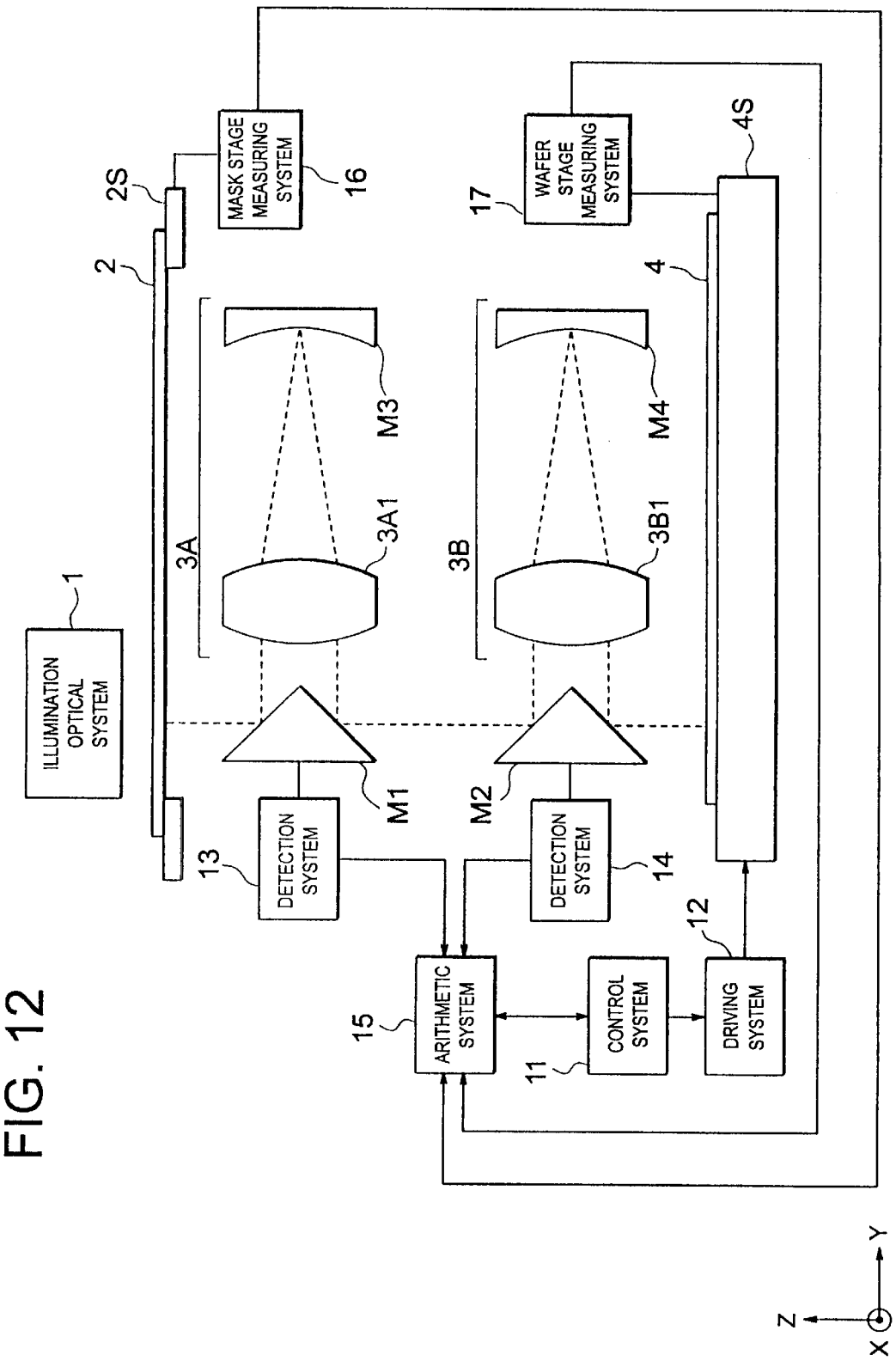
FIG. 12 is a schematic view showing a constitution of an exposure apparatus according to a fourth embodiment of the present invention.

FIG. 12 is a schematic view showing a constitution of an exposure apparatus according to the fourth embodiment of the present invention.

The exposure apparatus shown in FIG. 12 is a projection exposure apparatus designed to carry out exposure by projecting the unmagnified (i.e. the same size) image of a circuit pattern formed on the mask 2 onto the photosensitive substrate 4 coated with a photosensitive material on a glass substrate, and moving the mask 2 and the photosensitive substrate 4 relative to each other with respect to an unmagnifying projection optical system 3. The projection exposure apparatus based on such a system is disclosed, for example in U.S. Pat. No. 5,298,939.

In FIG. 12, a coordinate system is set such that the circuit pattern forming surface of the mask 2 can becomes an XY plane. An X axis is set in a direction perpendicular to a paper surface; a Y axis in a direction within the paper surface; and a Z axis in a direction orthogonal to the XY plane and within four surfaces.

The exposure apparatus shown comprises an illumination optical system for uniformly illuminating the mask 2 having patterns formed thereon to be transferred. As one similar to a system described in U.S. Pat. No. 5,298,939 can be used for this illumination optical system, explanation thereof will be omitted. A field of illumination (illumination area) formed on the mask 2 by the illumination optical system 1 can be formed in a trapezoidal shape having, for example a base extended in the X direction and an upper side in a −Y direction side from the base.

The mask 2 is supported, as in the case of the foregoing embodiments, by a mask stage 2S having an XY stage two-dimensionally movable within the XY plane and a θ stage (rotary stage) rotatable around the Z axis.

The projection optical system 3 consists of a first image-forming system 3A for forming an unmagnified intermediate image of the mask 2, and a second image-forming system 3B for forming the intermediate image again on the photosensitive substrate 4 in unmagnified state. The first image-forming system 3A consists of an optical path bending mirror M1, a lens group 3A1 and a concave mirror M3. The second image-forming system 3B consists of an optical path bending mirror M2, a lens group 3B1 and a concave mirror M4. A light transmitted through the pattern of the mask 2 is reflected by the optical path bending mirror M1, and proceeds in the +Y direction. Then, the light is passed through the lens group 3A1 and reflected by the concave mirror M3. And then, the light is passed again through the lens group 3A1 and reflected by the optical path bending mirror M1, proceeds in the −Z direction, and then forms an unmagnified intermediate image (lateral magnification=−1) of the mask 2. A light from this intermediate image is reflected by the optical path bending mirror M2, and proceeds in the +Y direction. Then, the light is passed through the lens group 3B1 and reflected by the concave mirror M4. The light is then passed through the lens group 3B1 again, reflected by the optical path bending mirror M2, and proceeds in the −Z direction to form an unmagnified secondary image (lateral magnification=+1) of the mask 2 on the photosensitive substrate 4.

The photosensitive substrate 4 is supported, as in the case of the foregoing embodiments, by a substrate stage 4S having an XY stage two-dimensionally movable within the XY plane and a θ stage (rotary stage) rotatable around the Z axis. This substrate stage 4S is driven and controlled by the driving system 12 based on a command from the control system 11.

Thus, by carrying out scanning exposure while moving the mask 2 and the photosensitive substrate 4 integrally in the Y direction with respect to the projection optical system 3, the mask pattern can be transferred to an exposure area extended in the Y direction on the photosensitive substrate 4. Subsequently, by moving the mask 2 and the photosensitive substrate 4 integrally in the X direction (stepping operation) and repeating the foregoing scanning exposure, the mask patterns can be transferred to all the areas on the photosensitive substrate 4.

According to the fourth embodiment, the exposure apparatus comprises a first detection system 13 for detecting the fluctuation amount of the first reflecting mirror M1 disposed as an optical path bending mirror disposed in the projection optical system 3 from the reference position, and a second detection system 14 for detecting the fluctuation amount of the second mirror M2 as an optical path bending mirror from the reference position. Similarly to the second embodiment, in the fourth embodiment, the exposure apparatus further comprises a mask stage measuring system 16 for measuring the coordinate position of the mask stage 2S, and a substrate stage measuring system 17 for measuring the coordinate position of the substrate stage 4S. The outputs of the first and second detection systems 13 and 14 and the mask and substrate stage measuring systems 16 and 17 are supplied to the arithmetic system 15. As in the case of the second embodiment, the arithmetic system 15 computes the correction amount of the photosensitive substrate 4, which is necessary for substantial alignment between the mask 2 and the photosensitive substrate 4 with respect to the projection optical system 3. This computation is performed based on the amount of positional or rotational shift of the pattern image from the reference image-forming position obtained based on the rotational fluctuation angles of the first and second reflecting mirrors M1 and M2 measured by the first and second measuring systems 13 and 14, information regarding the position of the mask stage 2S measured by the mask stage measuring system 16, and information regarding the position of the substrate stage measured by the substrate measuring system 17.

Information regarding the amount of correction computed in the arithmetic system is supplied to the control system 11. The control system 11 drives and controls the substrate stage 4S via the driving system 12 based on the information of the correction amount supplied from the arithmetic system 15. In this way, the photosensitive substrate 4 is moved by a required amount of correction, and the positional or rotational shift of the pattern image from the reference image-forming position is substantially corrected. Also, relative positional shift between the mask 2 and the photosensitive substrate 4 caused by relative positional shift between the mask stage 2S and the substrate stage 4S is substantially corrected. As a result, the mask 2 and the photosensitive substrate 4 are well aligned with each other with respect to the projection optical system 3.

According to the fourth embodiment, a large-area exposure area is obtained by joining a plurality of unit exposure areas for exposure. In this case, to further enhance the accuracy of joining among the unit exposure areas, during scanning exposure, the moving direction of at least one of the mask 2 and the photosensitive substrate 4 should not be limited in the Y direction, but the moving amount component of the +X or −X direction should preferably be added according to the rotational direction of the pattern image.

In each of the foregoing embodiments, the position correction of the mask and the photosensitive substrate is constantly performed according to the positional or rotational shift of the pattern image caused by the positional fluctuation of the reflecting member disposed in the projection optical system. However, such correction needs not be carried out constantly.

For example, correction may be carried out when movement to a next shot area after exposure for one shot area on the photosensitive substrate, at the time of replacement of the photosensitive substrate, or at the time of mask replacement.

Also, the position fluctuation of the reflecting member is constantly monitored by the detection system, and correction may be carried out when the amount of positional fluctuation of the reflecting member exceeds a specified permissible amount. This variation example will now be described by referring to, for example FIG. 11. In FIG. 11, a permissible amount for the positional fluctuation of the reflecting member is stored beforehand in the arithmetic system 15. Determination is made by the arithmetic system 15 as to whether the amount of positional fluctuation detected by the detection system 14 has reached this permissible amount or not. If the amount of positional fluctuation is within the permissible amount, then no position correction is performed for at least one of the mask and the photosensitive substrate. If the amount exceeds the permissible amount, an amount of correction is computed for at least one of the mask and the photosensitive substrate based on the amount of positional fluctuation, and the selected one of the mask and the photosensitive substrate is moved. If the amount of positional fluctuation exceeds the permissible amount, a display 18 as a display unit connected to the arithmetic system 15 should preferably display that the permissible amount has been exceeded.

POSSIBLE INDUSTRIAL APPLICATION

As apparent from the foregoing, according to the exposure apparatus and the exposure method of the present invention, without providing any surplus optical members in the optical path between the mask and the wafer as a photosensitive substrate, it is possible to carry out alignment between the mask and the wafer even during exposure as occasion demands according to the positional or rotational shift of the pattern image caused by the positional fluctuation of the reflecting member disposed in the projection optical system of the catadioptric type. Therefore, even if the pattern image is shifted in position or rotation because of fluctuation in the position of the reflecting member during exposure, by carrying out alignment between the mask and the wafer during exposure as occasion demands, it is possible to fabricate a good semiconductor device always in a well-aligned state.

What is claimed is:

1. An exposure apparatus for transferring a pattern on a mask onto a photosensitive substrate, comprising:

an illumination optical system;

a projection optical system, disposed in an optical path between the mask and the photosensitive substrate, having a reflecting member and projecting an image of the pattern on the mask illuminated by said illumination system onto the photosensitive substrate;

a detection system, connected to a member of said projection optical system, which detects a fluctuation amount from a reference position of said member of said projection optical system;

an arithmetic system, connected to said detection system, which cutes a correction amount regarding at least one of the mask and the photosensitive substrate based on the fluctuation amount detected by said detection system, said correction amount being necessary for substantial alignment between the pattern image formed in a moved state from a reference image-forming position of said projection optical system and the photosensitive substrate; and a driving system, connected to said arithmetic system, which moves at least the mask and the photosensitive substrate based on the correction amount computed by said arithmetic system.

2. The exposure apparatus according to claim 1, wherein said arithmetic system computes a movement amount of the pattern image from the reference image-forming position based on the fluctuation amount detected by said detection system, and computes the amount of correction based on the movement amount.

3. The exposure apparatus according to claim 2, wherein said arithmetic system computes amounts of positional and rotational shift of the pattern image from the reference image-forming position based on the fluctuation amount detected by said detection system, and computes an amount of correction for the mask, which is necessary for substantially correcting the amounts of positional and rotational shift, and the driving system moves only the mask based on the amount of correction computed by said arithmetic system.

4. The exposure apparatus according to claim 2, wherein said arithmetic system computes amounts of positional and rotational shift of the pattern image from the reference image-forming position based on the fluctuation amount detected by said detection system, and computes an amount of correction for the photosensitive substrate, which is necessary for substantially aligning the photosensitive substrate with the pattern image formed in a state where at least one of the amounts of positional and rotational shift occurs, and said driving system moves only the photosensitive substrate based on the amount of correction computed by said arithmetic system.

5. The exposure apparatus according to claim 2, wherein said arithmetic system computes amounts of positional and rotational shift of the pattern image from the reference image-forming position based on the fluctuation amount detected by said detection system, computes an amount of correction for the mask, which is necessary for substantially correcting one of the amounts of positional and rotational shift, and computes an amount of correction for the photosensitive substrate, which is necessary for substantially aligning the photosensitive substrate with the pattern image formed while the other of the amounts of positional and rotational shift occurs, and said driving system moves the mask and the photosensitive substrate based on the amounts of correction for the mask and the photosensitive substrate detected by said arithmetic system.

6. The exposure apparatus according to claim 1, wherein said arithmetic system computes amounts of positional and rotational shift of the pattern image from the reference image-forming position based on the fluctuation amount detected by said detection system, and computes an amount of correction for the mask, which is necessary for substantially correcting the amounts of positional and rotational shift, and said driving system moves only the mask based on the amount of correction computed by the arithmetic system.

7. The exposure apparatus according to claim 1, wherein said arithmetic system computes amounts of positional and rotational shift of the pattern image from the reference image-forming position based on the fluctuation amount detected by said detection system, and then computes an amount of correction for the photosensitive substrate, which is necessary for substantially aligning the photosensitive substrate with the pattern image formed in a state where at least one of the amounts of positional and rotational shift occurs, and said driving system moves only the photosensitive substrate based on the amount of correction computed by the arithmetic system.

8. The exposure apparatus according to claim 1, wherein said arithmetic system computes amounts of positional and rotational shift of the pattern image from the reference image-forming position based on the fluctuation amount detected by said detection system, computes an amount of correction for the mask, which is necessary for substantially correcting one of the amounts of positional and rotational shift, and computes an amount of correction for the photosensitive substrate, which is necessary for substantially aligning the photosensitive substrate with the pattern image formed in a state where the other of the amounts of positional and rotational shift occurs, and said driving system moves the mask and the photosensitive substrate based on the amounts of correction for the mask and the photosensitive substrate computed by said arithmetic system.

9. The exposure apparatus according to claim 1, wherein said driving system includes:

a mask stage which is movable with respect to said projection optical system, and which holds said mask;

a mask stage measuring system, optically connected to said mask stage, and which measures a position of said mask stage;

a substrate stage which is movable with respect to said projection optical system, and which holds said photosensitive substrate; and a substrate stage measuring system, optically connected to said substrate stage, and which measures a position of said substrate stage;

wherein said arithmetic system computes a correction amount for at least one of the mask and the photosensitive substrate, which is necessary for substantial alignment between the mask and the photosensitive substrate with respect to said projection optical system, based on a movement amount of the pattern image from the reference image-forming position obtained based on the fluctuation amount detected by said detection system, and based on information regarding the position of the mask stage measured by said mask stage measuring system, and based on information regarding the position of the substrate stage measured by said substrate stage measuring system, and wherein said driving system substantially aligns the mask and the photosensitive substrate with each other with respect to said projection optical system based on the amount of correction computed by said arithmetic system.

10. The exposure apparatus according to claim 9, wherein the pattern of the mask is transferred to each exposure area of the photosensitive substrate while moving the mask stage and the substrate stage in a specified direction in synchronization with each other with respect to said projection optical system.

11. An exposure method for transferring an image of a pattern formed on a mask onto a workpiece through a projection optical system, comprising:
- a detection step of detecting a fluctuation amount of a member of said projection optical system from a reference position;
- an arithmetic step of computing a correction amount for at least one of the mask and the workpiece, which is necessary for substantial alignment between the pattern image formed in a moved state from a reference image-forming position and the workpiece, based on the fluctuation amount detected in said detection step;
- an alignment step of moving at least one of the mask and the workpiece based on the correction amount computed in said arithmetic step, and carrying out alignment between the mask and the workpiece with respect to said projection optical system; and
- an exposure step of illuminating the mask by an illumination optical system in the state of alignment between the mask and the workpiece realized in the alignment step, and exposing the pattern of the mask through said projection optical system onto the workpiece.

12. The exposure method according to claim 11, wherein said detection step, said arithmetic step and said alignment step are performed before said exposure step.

13. The exposure method according to claim 12, wherein said detection step, said arithmetic step and said alignment step are performed during said exposure step as occasion demands.

14. The exposure method according to claim 13, further comprising a determination step of determining whether the fluctuation amount of the member of said projection optical system from the reference position is within a permissible amount,
wherein when the fluctuation amount exceeds the permissible amount, then said arithmetic step and said alignment step are performed.

15. The exposure method according to claim 14, wherein when the fluctuation amount exceeds the permissible amount, information regarding the fluctuation amount is displayed.

16. The exposure method according to claim 15, wherein in the arithmetic step, an amount of correction for at least one of the mask and the workpiece is computed, which is necessary for substantial alignment between the mask and the workpiece with respect to said projection optical system, based on a movement amount of the pattern image from the reference image-forming position obtained based on the fluctuation amount detected in said detection step, and based on information regarding a position of the mask stage which holds the mask and is movable with respect to said projection optical system, and based on information regarding a position of a workpiece stage which holds the workpiece and is movable with respect to said projection optical system.

17. The exposure method according to claim 12, wherein in said arithmetic step, an amount of correction is computed for at least one of the mask and the workpiece, which is necessary for substantial alignment between the mask and the workpiece with respect to the projection optical system, based on a movement amount of the pattern image from the reference image-forming position obtained based on the fluctuation amount detected in said detection step, and based on information regarding a position of a mask stage which holds the mask and is movable with respect to the projection optical system, and based on information regarding a position of a workpiece stage which holds the workpiece and is movable with respect to said projection optical system.

18. The exposure method according to claim 11, wherein said detection step, said arithmetic step and said alignment step are performed during said exposure step as occasion demands.

19. The exposure method according to claim 18, wherein in said arithmetic step, an amount of correction is computed for at least one of the mask and the workpiece, which is necessary for substantial alignment between the mask and the workpiece with respect to the projection optical system, based on the movement amount of the pattern image from the reference image-forming position obtained based on the fluctuation amount detected in said detection step, and based on information regarding a position of a mask stage which holds the mask and is movable with respect to said projection optical system, and based on information regarding a position of a workpiece stage which holds the workpiece and is movable with respect to said projection optical system.

20. The exposure method according to claim 11, further comprising a determination step of determining whether the fluctuation amount of the member of said projection optical system from the reference position is within a permissible amount,
wherein when the fluctuation amount exceeds the permissible amount, then said arithmetic step and said alignment step are performed.

21. The exposure method according to claim 20, wherein when the fluctuation amount exceeds the permissible amount, information regarding the fluctuation amount is displayed.

22. The exposure method according to claim 11, further comprising a determination step of determining whether the fluctuation amount of the member of said projection optical system is within a permissible amount,
wherein when the fluctuation amount exceeds the permissible amount, information regarding the fluctuation amount is displayed.

23. The exposure method according to claim 11, wherein in the arithmetic step, an amount of correction is computed for at least one of the mask and the workpiece, which is necessary for substantial alignment between the mask and the workpiece with respect to said projection optical system, based on a movement amount of the pattern image from the reference image-forming position obtained based on the fluctuation amount detected in said detection step, information regarding a position of a mask stage which holds the mask and is movable with respect to the projection optical system, and information regarding a position of a workpiece stage which holds the workpiece and is movable with respect to the projection optical system.

24. The exposure method according to claim 11, wherein in said detection step, the fluctuation amount of the member of the projection optical system from said reference position is optically detected.

25. The exposure method according to claim 11,
wherein the member of the projection optical system has a reflecting member.

26. The exposure method according to claim 25,
wherein the reflecting member reflects beam directing from the pattern on the mask to the photosensitive substrate.

27. An exposure apparatus for transferring a pattern on a mask onto a photosensitive substrate, comprising:
an illumination optical system;
a projection optical system, disposed in an optical path between the mask and the photosensitive substrate, having a plurality of optical axes crossing to each other, and projecting an image of said pattern on the mask illuminated by said illumination optical system onto the photosensitive substrate;
a detection system, optically connected to a reflecting member attached to said projection optical system, detecting a fluctuation amount from a reference position of the reflecting member;
an arithmetic system, connected to said detection system, computing a correction amount regarding at least one of the mask and the photosensitive substrate based on the fluctuation amount detected by said detection system, said correction amount being necessary for substantial alignment between the pattern image formed in a moved state from a reference image-forming position of said projection optical system and the photosensitive substrate; and
a driving system, connected to said arithmetic system, which moves at least one of the mask and the photosensitive substrate based on the correction amount computed by said arithmetic system.

28. The exposure apparatus according to claim 27,
wherein the reflecting member is arranged so as to reflect a beam directing from the mask to the photosensitive substrate.

29. The exposure apparatus according to claim 28,
wherein the reflecting member has a reflecting surface reflecting a beam directing from the mask to the photosensitive substrate, and is optically connected to said detection system at a position different from said reflecting surface.

30. The exposure apparatus according to claim 27,
wherein the reflecting member has a detection light reflecting surface at a position where the reflecting member is optically connected to said detection system, and
the detection light reflecting surface is directed to an outside of said projection optical system.

31. The exposure apparatus according to claim 30,
wherein the detection of the fluctuation amount by said detection system, the computing of the correction amount by said arithmetic system, and the movement of at least one of the mask and the photosensitive substrate by said driving system are executed before the pattern on the mask is transferred onto the photosensitive substrate.

32. The exposure apparatus according to claim 30,
wherein the detection of the fluctuation amount by said detection system, the computing of the correction amount by said arithmetic system, and the movement of at least one of the mask and the photosensitive substrate by said driving system are executed at any time when the pattern on the mask is transferred onto the photosensitive substrate.

33. The exposure apparatus according to claim 30,
wherein said arithmetic system determines whether or not the fluctuation amount detected by said detection system is a permissible amount, and
when the fluctuation amount is not a permissible amount, said arithmetic system instructs said driving system to move at least one of the mask and the photosensitive substrate.

34. The exposure apparatus according claim 27,
wherein said arithmetic system determines whether or not the fluctuation amount detected by said detection system is a permissible amount, and
when the fluctuation amount is not a permissible amount, said arithmetic system instructs said driving system to move at least one of the mask and the photosensitive substrate.

35. The exposure apparatus according to claim 30,
wherein said driving system comprises:
a mask stage, movable with respect to said projection optical system, and which holds said mask;
a mask stage measuring system, connected to said mask stage, and which measures a position of the mask stage;
a substrate stage, movable with respect to said projection optical system, and which holds the photosensitive substrate; and
a substrate stage measuring system, connected to said substrate stage, and which measures a position of the substrate stage;
wherein said arithmetic system computes a correction amount regarding at least one of the mask and the photosensitive substrate while taking into account positional information by said mask stage measuring system and positional information by said substrate stage measuring system.

36. The exposure apparatus according to claim 35,
wherein the exposure apparatus transfers a pattern of the mask onto an exposure area of the photosensitive substrate while synchronously moving the mask stage and the substrate stage relative to said projection optical system along a specified direction.

37. The exposure apparatus according to claim 1,
wherein said member of said projection optical system is optically connected to said detection system.

38. The exposure apparatus according to claim 1,
wherein the reflecting member reflects a beam directing from the pattern on the mask toward the photosensitive substrate.

39. The exposure apparatus according to claim 38,
wherein said member of said projection optical system includes the reflecting member.

40. An exposure method for transferring a pattern on a mask onto a photosensitive substrate, comprising steps of:
illuminating the mask with the exposure apparatus according to claim 1, and
exposing the image of the pattern on the mask onto the photosensitive substrate with the exposure apparatus.

41. An exposure method for transferring a pattern on a mask onto a photosensitive substrate, comprising the steps of:
illuminating the mask with the exposure apparatus according to claim 27, and
exposing the image of the pattern on the mask onto the photosensitive substrate with the exposure apparatus.

42. An exposure apparatus for transferring a pattern on a mask onto a photosensitive substrate, comprising:

an illumination optical system;

a projection optical system which is arranged in an optical path between the mask and the photosensitive substrate and which projects an image of the pattern on the mask illuminated by the illumination optical system onto the photosensitive substrate;

a detection system which is optically connected to a member attached to the projection optical system and which detects a fluctuation amount from a reference position of the member;

an arithmetic system which is connected to the detection system and which computes a correction amount regarding at least one of the mask and the photosensitive substrate based on the fluctuation amount being necessary for substantial alignment between the pattern image formed in a moved state from a reference image-forming position of the projection optical system and the photosensitive substrate; and a driving system which is connected to the arithmetic system and which moves at least one of the mask and the photosensitive substrate based on the correction amount computed by the arithmetic system.

43. The exposure apparatus according to claim 42, wherein the driving system includes:

a mask stage which is movable with respect to the projection optical system and which holds the mask;

a mask stage measuring system which is optically connected to the mask stage and which measures a position of the mask stage;

a substrate stage which is movable with respect to the projection optical system and which holds the photosensitive substrate; and a substrate stage measuring system which is optically connected to the substrate stage and which measures a position of the substrate stage;

wherein the pattern of the mask is transferred to each exposure area of the photosensitive substrate while moving the mask stage and the substrate stage along a specified direction in synchronization with each other with respect to the projection optical system.

44. The exposure apparatus according to claim 43, wherein the arithmetic system computes a correction amount for at least one of the mask and the photosensitive substrate, which is necessary for substantial alignment between the mask and the photosensitive substrate with respect to the projection optical system, based on a movement amount of the pattern image from the reference image-forming position obtained based on the fluctuation amount detected by the detection system, and based on information regarding the position of the mask stage measured by the mask stage measuring system, and based on information regarding the position of the substrate stage measured by the substrate stage measuring system, and wherein the driving system substantially aligns the mask and the photosensitive substrate with each other with respect to the projection optical system based on the amount of correction computed by the arithmetic system.

45. The exposure apparatus according to claim 43, wherein the arithmetic system determines whether or not the fluctuation amount detected by the detection system is a permissible amount.

46. The exposure apparatus according to claim 45, wherein the arithmetic system instructs the driving system to move at least one of the mask and the photosensitive substrate when the fluctuation amount is not a permissible amount.

47. The exposure apparatus according to claim 45, wherein the detection of the fluctuation amount by the detection system, the computing of the correction amount by the arithmetic system and the movement of at least one of the mask and the photosensitive substrate by the driving system are executed at any time when the pattern on the mask is transferred onto the photosensitive substrate.

48. The exposure apparatus according to claim 47, wherein the arithmetic system instructs the driving system to move at least one of the mask and the photosensitive substrate when the fluctuation amount is not a permissible amount.

49. The exposure apparatus according to claim 45, wherein when the fluctuation amount exceeds the permissible amount, information regarding the fluctuation amount is displayed.

50. An exposure method for transferring a pattern on a mask onto a photosensitive substrate, comprising the steps of:

illuminating the mask with the exposure apparatus according to claim 42, and exposing the image of the pattern on the mask onto the photosensitive substrate with the exposure apparatus.

51. An exposure apparatus for transferring a pattern on a mask onto a photosensitive substrate, comprising:

an illumination optical system;

a projection optical system which is arranged in an optical path between the mask and the photosensitive substrate and which projects an image of the pattern on the mask illuminated by the illumination optical system onto the photosensitive substrate;

a detection system which is optically connected to a member attached to the projection optical system and which detects a fluctuation amount of the member;

an arithmetic system which is connected to the detection system and which computes a correction amount regarding at least one of the mask and the photosensitive substrate based on the fluctuation amount being necessary for substantial alignment between the pattern image formed in a moved state from a predetermined image-forming position of the projection optical system and the photosensitive substrate: and a driving system which is connected to the arithmetic system and which moves at least one of the mask and the photosensitive substrate based on the correction amount computed by the arithmetic system.

52. The exposure apparatus according to claim 51, wherein the driving system includes:

a mask stage which is movable with respect to the projection optical system and which holds the mask;

a mask stage measuring system which is optically connected to the mask stage and which measures a position of the mask stage;

a substrate stage which is movable with respect to the projection optical system and which holds the photosensitive substrate; and a substrate stage measuring system which is optically connected to the substrate stage and which measures a position of the substrate stage;

wherein the pattern of the mask is transferred to each exposure area of the photosensitive substrate while moving the mask stage and the substrate stage along a specified direction in synchronization with each other with respect to the projection optical system.

53. The exposure apparatus according to claim 52, wherein the arithmetic system determines whether or not the fluctuation amount detected by the detection system is a permissible amount.

54. The exposure apparatus according to claim 53, wherein the arithmetic system instructs the driving system to move at least one of the mask and the photosensitive substrate when the fluctuation amount is not a permissible amount.

55. The exposure apparatus according to claim 53, wherein when the fluctuation amount exceeds the permissible amount, information regarding the fluctuation amount is displayed.

56. An exposure method for transferring a pattern on a mask onto a photosensitive substrate, comprising the steps of:

illuminating the mask with the exposure apparatus according to claim 51, and exposing the image of the pattern on the mask onto the photosensitive substrate with the exposure apparatus.

\* \* \* \* \*